(12) United States Patent
Kim et al.

(10) Patent No.: US 10,809,507 B2
(45) Date of Patent: *Oct. 20, 2020

(54) LENS AND LIGHT EMITTING MODULE FOR SURFACE ILLUMINATION

(71) Applicant: Seoul Semiconductor Co., Ltd., Ansan-si (KR)

(72) Inventors: Eun Ju Kim, Ansan-si (KR); Ki Bum Nam, Ansan-si (KR)

(73) Assignee: Seoul Semiconductor Co., Ltd., Ansan-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/374,756

(22) Filed: Apr. 4, 2019

(65) Prior Publication Data

US 2019/0234583 A1    Aug. 1, 2019

Related U.S. Application Data

(63) Continuation of application No. 15/367,604, filed on Dec. 2, 2016, now Pat. No. 10,281,111, which is a
(Continued)

(30) Foreign Application Priority Data

Aug. 26, 2013 (KR) .......................... 10-2013-0101191

(51) Int. Cl.
    *G02B 19/00* (2006.01)
    *H01L 33/58* (2010.01)
    (Continued)

(52) U.S. Cl.
    CPC ............ *G02B 19/0014* (2013.01); *F21K 9/69* (2016.08); *F21V 19/0015* (2013.01);
    (Continued)

(58) Field of Classification Search
    CPC ........ F21V 5/048; F21V 19/0015; F21V 5/04; F21V 7/05; F21K 9/69; G02B 19/0014;
    (Continued)

(56) References Cited

U.S. PATENT DOCUMENTS 7,572,036 B2    8/2009    Yoon et al.
7,866,844 B2    1/2011    Yamaguchi
(Continued)

FOREIGN PATENT DOCUMENTS

CN    102818216    12/2012
CN    103090311    5/2013
(Continued)

OTHER PUBLICATIONS

Extended European Search Report dated Feb. 19, 2015, in European Patent Application 14181966.4.
(Continued)

*Primary Examiner* — Bao Q Truong
(74) *Attorney, Agent, or Firm* — H.C. Park & Associates, PLC

(57) ABSTRACT

A light emitting module including a circuit board, light emitting elements disposed on the circuit board, each light emitting element including light emitting diode chips and a wavelength conversion layer coated on the light emitting diode chips, and a lens disposed on the light emitting elements and configured to diffuse light emitted from the light emitting elements, in which the lens includes a concave part having a light incident surface and an upper surface through which light exits out from the lens, the upper surface includes a convex portion including sections, at least two of the sections having different curvatures from each other, and the at least two of the sections each has a thickness equal to or greater than 1 μm, and less than the width of the light emitting element.

18 Claims, 17 Drawing Sheets

Related U.S. Application Data continuation of application No. 14/469,100, filed on Aug. 26, 2014, now Pat. No. 9,530,947.

(51) Int. Cl.
| | | |
|---|---|---|
| *F21K 9/69* | (2016.01) | |
| *F21V 19/00* | (2006.01) | |
| *H01L 33/50* | (2010.01) | |
| *G02F 1/13357* | (2006.01) | |
| *H01L 33/08* | (2010.01) | |
| *F21Y 115/10* | (2016.01) | |
| *F21V 7/05* | (2006.01) | |

(52) U.S. Cl.
CPC ........ *G02B 19/0061* (2013.01); *H01L 33/505* (2013.01); *H01L 33/58* (2013.01); *F21V 7/05* (2013.01); *F21Y 2115/10* (2016.08); *G02F 1/133603* (2013.01); *H01L 33/08* (2013.01); *H01L 33/50* (2013.01)

(58) Field of Classification Search
CPC ... G02B 19/0061; H01L 33/505; H01L 33/58; H01L 33/08; H01L 33/50; F21Y 2115/10; F21Y 2101/00; G02F 1/133603
See application file for complete search history.

(56) References Cited

U.S. PATENT DOCUMENTS

| | | | |
|---|---|---|---|
| 8,469,552 B2 | 6/2013 | Moeller | |
| 8,585,254 B2 | 11/2013 | Arai et al. | |
| 9,134,007 B2 * | 9/2015 | Wang | .............. F21V 5/046 |
| 9,530,947 B2 * | 12/2016 | Kim | .............. G02B 19/0061 |
| 10,281,111 B2 * | 5/2019 | Kim | .............. F21V 19/0015 |
| 2006/0152140 A1 | 7/2006 | Brandes | |
| 2007/0091615 A1 | 4/2007 | Hsieh et al. | |
| 2008/0100773 A1 * | 5/2008 | Hwang | .............. G02B 3/0056 |
| | | | 349/62 |
| 2010/0165637 A1 | 7/2010 | Premysler | |
| 2010/0284193 A1 | 11/2010 | Ford | |
| 2010/0290234 A1 * | 11/2010 | Bierhuizen | .............. F21V 5/04 |
| | | | 362/311.02 |
| 2011/0044053 A1 * | 2/2011 | Yamaguchi | .............. G02B 7/023 |
| | | | 362/296.05 |
| 2011/0085352 A1 | 4/2011 | Ito et al. | |
| 2011/0116272 A1 | 5/2011 | Bak et al. | |
| 2011/0249451 A1 | 10/2011 | Fujii et al. | |
| 2012/0014115 A1 | 1/2012 | Park et al. | |
| 2012/0020093 A1 | 1/2012 | Yang et al. | |
| 2013/0155690 A1 * | 6/2013 | Chen | .............. F21V 5/04 |
| | | | 362/311.02 |
| 2013/0322088 A1 | 12/2013 | Huang et al. | |

FOREIGN PATENT DOCUMENTS

| | | |
|---|---|---|
| DE | 102009021182 | 11/2010 |
| EP | 2098905 | 9/2009 |
| EP | 2378338 | 10/2011 |
| JP | 2003-110146 | 4/2003 |
| JP | 2006-114863 | 4/2006 |
| JP | 2009-192915 | 8/2009 |
| JP | 2009-211990 | 9/2009 |
| JP | 2011-054756 | 3/2011 |
| JP | 2011-159970 | 8/2011 |
| JP | 2012-243641 | 12/2012 |
| JP | 2012-244070 | 12/2012 |
| KR | 10-2010-0009689 | 1/2010 |
| KR | 10-2010-0057384 | 5/2010 |
| KR | 10-2011-0109113 | 6/2011 |
| KR | 10-2013-0062005 | 6/2013 |
| KR | 10-2013-0081866 | 7/2013 |
| KR | 10-2013-0081867 | 7/2013 |
| WO | 2012/011528 | 1/2012 |

OTHER PUBLICATIONS

International Search Report dated May 29, 2013, in International Patent Application No. PCT/KR2013/001041.
Written Opinion dated May 29, 2013, in International Patent Application No. PCT/KR2013/001041.
Non-Final Office Action dated Jan. 15, 2016 in U.S. Appl. No. 14/469,100.
Notice of Allowance dated Aug. 17, 2016 in U.S. Appl. No. 14/469,100.
Non-Final Office Action dated Feb. 7, 2017 in U.S. Appl. No. 14/379,423.
Notice of Allowance dated Jul. 13, 2017 in U.S. Appl. No. 14/379,423.
Office Action dated Feb. 6, 2018, issued in Japanese Patent Application No. 2014-171786.
Notification of Reasons for Refusal dated Oct. 9, 2018, issued in Japanese Patent Application No. 2014-171786.
Non-Final Office Action dated Jan. 19, 2017, issued in U.S. Appl. No. 15/367,604.
Final Office Action dated Sep. 12, 2017, issued in U.S. Appl. No. 15/367,604.
Non-Final Office Action dated May 29, 2018, issued in U.S. Appl. No. 15/367,604.
Notice of Allowance dated Dec. 28, 2018, issued in U.S. Appl. No. 15/367,604.
Office Action dated Jul. 21, 2019, issued in Korean Patent Application No. 10-2013-0101191.
Extended European Search Report dated May 25, 2020, in European Patent Application No. EP 20 16 2104.

* cited by examiner (a)

(b)

(c)

(d)

LENS AND LIGHT EMITTING MODULE FOR SURFACE ILLUMINATION

CROSS-REFERENCE TO RELATED APPLICATION

This application is a continuation of U.S. patent application Ser. No. 15/367,604, filed on Dec. 2, 2016, which is a continuation of U.S. patent application Ser. No. 14/469,100, filed on Aug. 26, 2014, now issued as U.S. Pat. No. 9,530,947, issued on Dec. 27, 2016, and claims priority from and the benefit of Korean Patent Application 10-2013-0101191, filed on Aug. 26, 2013, each of which is hereby incorporated by reference for all purposes as if fully set forth herein.

BACKGROUND

Field

The present invention relates to a light emitting module, and more particularly, to a lens for surface illumination and a light emitting module for surface illumination including the same.

Discussion of the Background

A light emitting module for backlighting a liquid crystal display or a light emitting module for surface illumination used in a surface illumination apparatus may include light emitting elements mounted on a circuit board and a lens for diffusing light emitted from the light emitting elements at a wide angle. Light may be uniformly irradiated over a wide area with a smaller number of light emitting elements by uniformly diffusing the light emitted from the light emitting elements using the lens.

FIGS. 1A and 1B are schematic cross-sectional view and perspective view for describing a light emitting module and a lens according to the related art.

Referring to FIGS. 1A and 1B, the light emitting module includes a circuit board 100, a light emitting element 200, and a lens 300. The circuit board 100 may be a printed circuit board provided with a circuit for supplying power to the light emitting element 200.

The light emitting element 200 may include a light emitting diode chip 210, a molding part 230 covering the light emitting diode chip 210, and a package substrate 250. The molding part 230 includes a phosphor configured to convert a wavelength of light emitted from the light emitting diode chip 210, and which may have a lens shape. The package substrate 250 may have a recess for mounting the light emitting diode chip 210. The light emitting element 200 is electrically connected to the circuit board 100.

Meanwhile, the lens 300 may include a lower surface 310 and an upper surface 350, and may further include a flange 370 and leg parts 390. The leg parts 390 are attached on the circuit board 100 so that the lens 300 is disposed over the light emitting element 200. As illustrated in FIG. 1B, the leg parts 390 are may be configured as a group of three and disposed at regular triangular apexes.

The lens 300 includes a light incident surface 330 on which light is incident from the light emitting element 200 and a light emitting surface 350 from which the incident light is emitted. The light incident surface 330 is an inner surface of a concave part 320, which may be shell-shaped, which is disposed on the lower surface 310 of the lens 300. The concave part 320 is disposed on the light emitting element 200 and thus the light emitted from the light emitting element 200 is incident into the lens 300 through the light incident surface 330. The light emitting surface 350 emits the light incident into the lens 300 at a wide orientation angle.

The light emitting module according to the related art diffuses the light emitted from the light emitting element 200 through the lens 300 to implement uniform light over a wide area. However, the light emitting element 200 mounted on the circuit board 100 may adopt the package substrate 250, and therefore a size of the light emitting element 200 may be relatively large. Therefore, an inlet and a height of the concave part 320 for forming the light incident surface 330 of the lens 300 may be relatively large, and as a result, it may be difficult to slim the lens 300. In addition, the beam angle spread of light emitted from the light emitting element 200 may be relatively narrow, and therefore it may be difficult to diffuse light through the lens 300.

Further, the light emitting element 200 is disposed under the lower surface 310 of the lens 300 and therefore some of the light emitted from the light emitting element 200 may not be incident into the lens 300 and may be lost below the lower surface 310 of the lens 300.

SUMMARY

Exemplary embodiments of the present invention provide a technology for slimming a lens for a surface light source and a light emitting module.

Exemplary embodiments of the present invention also provide a lens and a light emitting module capable of reducing a loss of light emitted from a light emitting element.

Exemplary embodiments of the present invention also provide a light emitting module capable of providing light having uniform color distribution and luminous intensity over a wide area by adopting a light emitting element suitable for a surface light source.

Additional features of the invention will be set forth in the description which follows, and in part will be apparent from the description, or may be learned by practice of the invention.

An exemplary embodiment of the present invention discloses a light emitting module including: a circuit board; light emitting elements mounted on the circuit board; and a lens coupled with the circuit board and diffusing light emitted from the light emitting elements. The lens includes a concave part defining a light incident surface on which light is incident and the light emitting element is substantially disposed within a concave part of the lens. Since the light emitting elements are disposed within the concave part, most of the light emitted from the light emitting elements may be incident into the lens to reduce a loss of light below a lower surface of the lens.

The light emitting element is a chip level light emitting element and differs from the light emitting diode package including a package main body according to the related art. That is, the light emitting element does not include a mounting member for mounting a light emitting diode chip and the circuit board is used as the mounting member for mounting the light emitting diode chip.

The chip level light emitting element includes the light emitting diode chip and a wavelength conversion layer coated on the light emitting diode chip. The wavelength conversion layer may cover an upper surface and side surfaces of the light emitting diode chip. In particular, the light emitting diode chip may be a flip chip type light emitting diode chip flip-bonded to the circuit board. The flip chip type light emitting diode chip may be directly mounted on the circuit board to more reduce a size of the light emitting element than that of the light emitting element according to the related art using the package substrate, thereby slimming the light emitting module. Further, since the size of the light emitting element is small, a size of the concave part of the lens may be reduced and an overall height of the lens may be reduced.

A width of an inlet of the concave part of the lens may be less than three times a width of the light emitting element. The width of the inlet of the concave part may be set to be less than three times the width of the light emitting element to reduce an alignment error between the lens and the light emitting element.

The lens includes a lower surface having the concave part and an upper surface through which light incident on a light incident surface of the concave part is emitted. The light incident surface of the lens is an inner surface of the concave part and is defined by a shape of the concave part. The light incident surface of the lens may include an upper end surface and side surfaces connected from the upper end surface to the inlet of the concave part. The concave part may have a shape having a width narrowed upward from the inlet thereof to the upper end surface. The side surface may be an inclined surface having a predetermined gradient from the inlet of the concave part to the upper end surface, but may be a bent inclined surface having a reduced gradient from the inlet to the upper end surface. The upper end surface may be a flat surface, but is not limited thereto and therefore may include a concave surface or a convex surface and may further include a light scattering pattern.

The upper surface of the lens has a shape to diffuse the light incident into the lens so that the light has a wide directional distribution. The upper surface of the lens may have a concave surface disposed near a central axis and a convex surface connected from the concave surface. Unlike this, the upper surface of the lens may have the flat surface disposed near the central axis and the convex surface connected from the flat surface. The shape of the upper end surface may include the flat surface instead of the concave surface according to the related art or the light scattering pattern, and the like to reduce the influence on the directional distribution of light even though the central axes of the light emitting element and the lens are mis-aligned, thereby increasing an alignment tolerance between the light emitting element and the lens.

Meanwhile, the lower surface of the lens includes a flat surface enclosing the concave part and an inclined surface enclosing the flat surface. The flat surface adheres to the circuit board. When a reflection sheet is disposed on the circuit board, the flat surface adheres to the reflection sheet. Meanwhile, the inclined surface is inclined upward from the flat surface and has a gradient less than approximately 10° with respect to the flat surface. Therefore, it is possible to reduce the loss of light due to internal total reflection inside the lens and diffuse light at a wide directional distribution by using the inclined surface.

Meanwhile, the lower surface of the lens may be provided with leg parts. The leg parts may be formed on the inclined surface. The leg parts of the lens are attached to the circuit board.

An exemplary embodiment of the present invention also discloses a first conductive type semiconductor layer; a plurality of mesas disposed on the first conductive type semiconductor layer, spaced apart from each other and each including an active layer and a second conductive type semiconductor layer; reflection electrodes disposed on the plurality of mesas to ohmic-contact the second conductive type semiconductor layer; a current diffusing layer covering the plurality of mesas and the first conductive type semiconductor layer, disposed within upper areas of each mesa, having openings which expose the reflection electrodes, ohmic-contacting the first conductive type semiconductor layer, and insulated from the plurality of mesas, in which the light emitting diode chips is flip-bonded with the circuit board.

The current diffusing layer covers the plurality of mesas and the first conductive type semiconductor layer and thus the current diffusing layer improves current diffusing performance.

The first conductive type semiconductor layer is continuous. Further, the plurality of mesas may have elongated shapes extending in parallel with each other in one direction and the openings of the current diffusing layer may be disposed to be biased to the same end side of the plurality of mesas. Therefore, pads connecting between the reflection electrodes exposed through the openings of the current diffusing layer may be easily formed.

The current diffusing layer may include reflection metal such as Al. Therefore, in addition to light reflection by the reflection electrodes, the light reflection by the current diffusing layer may be obtained and therefore light progressed through side walls of the plurality of mesas and the first conductive type semiconductor layer may be reflected.

Meanwhile, the reflection electrodes may each include a reflection metal layer and a barrier metal layer. Further, the barrier metal layer may cover an upper surface and side surfaces of the reflection metal layer. Therefore, it is possible to prevent the reflection metal layer from deteriorating by preventing the reflection metal layer from being exposed to the outside.

The light emitting diode chip may further include: an upper insulating layer covering at least a portion of the current diffusing layer and having the openings through which is the reflection electrodes are exposed; a second pad disposed on the upper insulating layer and being connected to the exposed reflection electrodes through the openings of the upper insulating layer; and a first pad connected to the current diffusing layer. The first pad and the second pad may be formed to have the same shape and size to easily perform the flip-chip bonding.

Further, the light emitting diode chip may further include a lower insulating layer disposed between the plurality of mesas and the current diffusing layer to insulate the current diffusing layer from the plurality of mesas. The lower insulating layer may have openings disposed within upper areas of each mesa and exposing the reflection electrodes.

Further, the openings of the current diffusing layer may each have a width wider than that of the openings of the lower insulating layer so that all the openings of the lower insulating layer are exposed. That is, side walls of the openings of the current diffusing layer are disposed on the lower insulating layer. In addition, the light emitting diode chip may further include an upper insulating layer covering at least a portion of the current diffusing layer and including the openings exposing the reflection electrodes. The upper insulating layer may cover the side walls of the openings of the current diffusing layer.

The lower insulating layer may be a reflective dielectric layer, for example, a distributed Bragg reflector (DBR).

Meanwhile, the light emitting diode chip may further include a growth substrate and the growth substrate may be, for example, a sapphire substrate or a gallium nitride substrate. The wavelength conversion layer covers the growth substrate to convert a wavelength of light emitted from the growth substrate to the outside.

An exemplary embodiment of the present invention also discloses a concave part defining a light incident surface on which light is incident and a light emitting surface through which the light incident on the lens is emitted and at least one of the light incident surface of the concave part and the light emitting surface includes a plurality of sections which are at a position of 15° or more from the central axis and are sequentially connected in a height direction.

Adjacent sections of the plurality of sections may have different curvatures. Further, the plurality of sections include first, second, and third sections sequentially connected and a vertical direction height of the first, second, and third sections may be equal to or more than 1 µm and may be less than a width of the light emitting element. Further, the vertical direction height of each of the plurality of sections may be equal to or more than 1 µm and may be less than the width of the light emitting element.

A plurality of color separations are generated in a spatial color distribution of light having different wavelengths by the plurality of sections and the plurality of light emitting elements and the plurality of lens are arranged to make areas in which the color separation is generated overlap each other, thereby implementing the uniform spatial color distribution.

The concave part and the light emitting surface of the lens may have a rotating body shape with respect to the central axis.

Meanwhile, a virtual reference surface having a single curvature may go across the first, second, and third sections, respectively. Further, a distance between points on the first, second, and third sections and the virtual reference surface having the single curvature may be about 10 µm, or preferably, about 5 µm.

Further, the light emitting surface may have the convex part having a width narrowed upward and the concave part having a width narrowed upward and the concave part may be positioned to be closer to the central axis than the convex part. Further, the sections of the concave part may have a height lower than that of the sections of the convex part.

An exemplary embodiment of the present invention further discloses light emitting module including a circuit board, light emitting elements disposed on the circuit board, each light emitting element including light emitting diode chips and a wavelength conversion layer coated on the light emitting diode chips, and a lens disposed on the light emitting elements and configured to diffuse light emitted from the light emitting elements, in which the lens includes a concave part having a light incident surface and an upper surface through which light exits out from the lens, the upper surface includes a convex portion including sections, at least two of the sections having different curvatures from each other, and the at least two of the sections each has a thickness equal to or greater than 1 µm, and less than the width of the light emitting element.

An exemplary embodiment of the present invention also discloses a lens configured to diffuse light emitted from light emitting elements, the lens including a concave part defining a light incident surface and an upper surface through which light incident on the lens exits the lens, in which the upper surface includes a convex portion including sections, at least two of the sections having different curvatures from each other, and the at least two of the sections each has a thickness equal to or greater than 1 µm, and less than the width of the light emitting element.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the principles of the invention.

FIGS. 23A and 23B are simulation diagrams for describing a spatial distribution of light, in which FIG. 23A illustrates the spatial distribution of light in the case in which a plurality of sections is not formed and FIG. 23B illustrates the spatial distribution of light in the case in which the plurality of sections is formed.

DETAILED DESCRIPTION OF THE ILLUSTRATED EMBODIMENTS

Figure 1A:
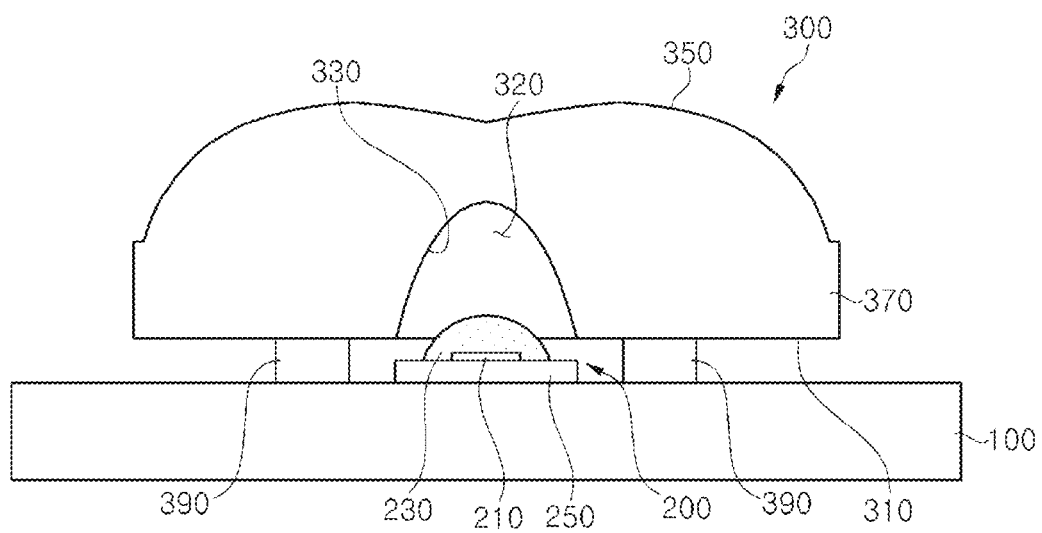
FIG. 1A is a cross-sectional view for describing a light emitting module according to the related art.

Hereinafter, exemplary embodiments of the present invention will be described in detail with reference to the accompanying drawings. The exemplary embodiments of the present invention to be described below are provided by way of example so that the idea of the present invention can be sufficiently transferred to those skilled in the art to which the present invention pertains. Therefore, the present invention is not limited to the exemplary embodiments set forth herein but may be modified in many different forms. In the accompanying drawings, widths, lengths, thicknesses, or the like, of components may be exaggerated for convenience. Like reference numerals denote like elements throughout the specification.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present. It will be understood that for the purposes of this disclosure, "at least one of X, Y, and Z" can be construed as X only, Y only, Z only, or any combination of two or more items X, Y, and Z (e.g., XYZ, XYY, YZ, ZZ).

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Figure 2A:
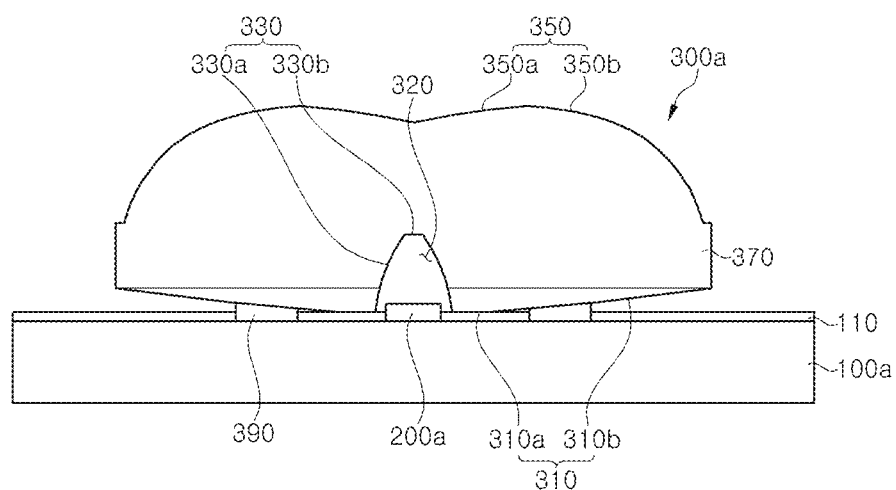
FIG. 2A is a cross-sectional view for describing a light emitting module according to an exemplary embodiment of the present invention.
Figure 2B:
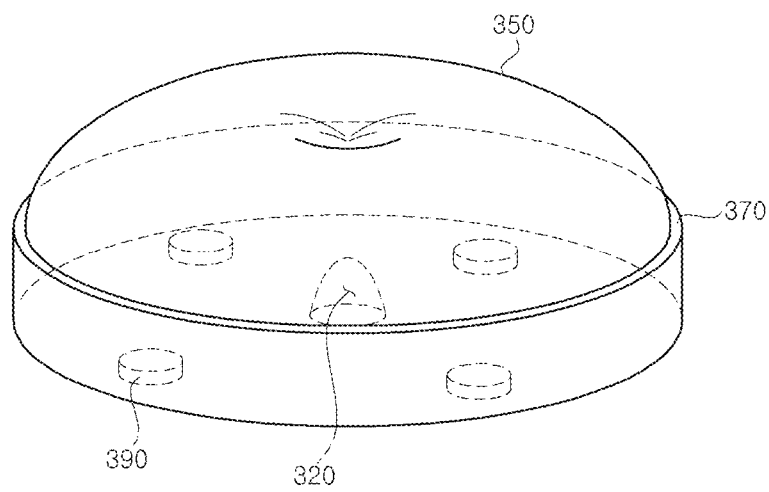
FIG. 2B is a perspective view of a lens adopted in the light emitting module according to the exemplary embodiment of the present invention.
Figure 2C:
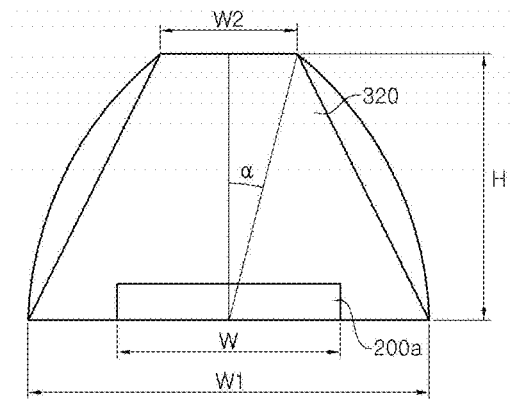
FIG. 2C is a schematic diagram for describing a shape of a concave part of a lens according to the exemplary embodiment of the present invention.
Figure 2D:
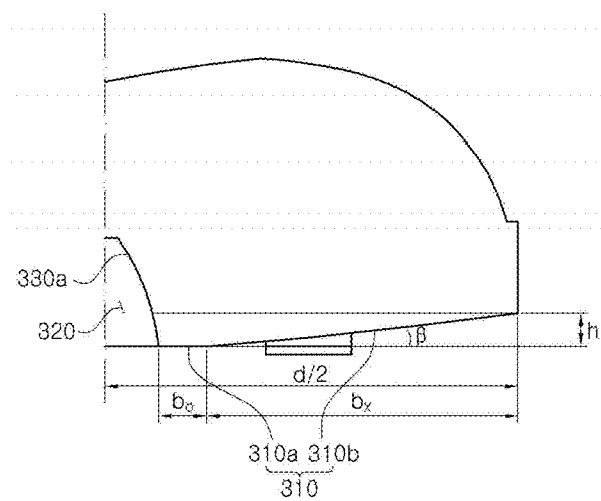
FIG. 2D is a partially enlarged cross-sectional view of the lens adopted in the light emitting module according to the exemplary embodiment of the present invention.

FIG. 2A is a cross-sectional view for describing a light emitting module according to an exemplary embodiment of the present invention, FIG. 2B is a perspective view of a lens 300a of the light emitting module, FIG. 2C is a schematic diagram for describing a concave part 320 of the lens 300a, and FIG. 2D is a partially enlarged cross-sectional view for describing a lower surface 310 of the lens 300a.

Referring first to FIG. 2A, the light emitting module includes a circuit board 100a, a light emitting element 200a, and the lens 300a. Further, the light emitting module may include a reflection sheet 110.

The circuit board 100a is a printed circuit board on which a circuit pattern is formed. Here, the case in which one light emitting element 200a is mounted on the circuit board 100a is illustrated, but a plurality of light emitting elements 200a may be aligned on the circuit board 100a and the lens 300a may be disposed over each light emitting element 200a.

Unlike the light emitting diode package according to the related art, the light emitting element 200a does not have a chip mounting member for mounting a light emitting diode chip and is directly mounted on the circuit board 100a by flip bonding, without using a bonding wire. That is, the circuit board 100a performs a function of the chip mounting member for mounting the light emitting diode chip. The light emitting element 200a does not use the bonding wire and therefore does not require a molding part for protecting the wire. The light emitting element 200a according to exemplary embodiments of the present invention will be described below in detail with reference to FIG. 6.

The reflection sheet 110 is disposed between the lens 300a and the circuit board 100a. The reflection sheet 110 may be coated with a white reflection material having high reflectivity so as to reflect light having a wide wavelength range of a visible area. The reflection sheet 110 reflects light, which is emitted toward the circuit board 100a side, into the lens 300a.

The lens 300a may include a lower surface 310 and an upper surface 350 and may further include a flange 370 and leg parts 390. The lower surface 310 includes a concave part 320, a flat surface 310a enclosing the concave part 320, and an inclined surface 310b enclosing the flat surface 310a.

The concave part 320 defines a light incident surface 330 through which light is incident from the light emitting element 200a into the lens 300a. That is, the light incident surface 330 is an inner surface of the concave part 320. The light incident surface 330 includes a side surface 330a and an upper end surface 330b. The concave part 320 has a shape narrowed upward from an inlet. The side surface 330a may be an inclined surface having a predetermined gradient from the inlet to the upper end surface 330b, and to the contrary, may be an inclined surface having a reduced gradient from the inlet to the upper end surface 330b. That is, as illustrated in FIG. 2C, the side surface 330a is shown by a straight line or a curved line protruding upward in a vertical cross-sectional view.

The light emitting element 200a is substantially disposed inside the concave part 320. To this end, a width W1 of the inlet of the concave part 320 is wider than a width w of the light emitting element 200a. Meanwhile, the width W1 of the inlet of the concave part 320 is less than three times the width w of the light emitting element 200a. According to the exemplary embodiments of the present invention, the light emitting element 200a has a relatively smaller size than the light emitting element 200 according to the related art, and therefore there is a need to precisely align the light emitting element 200a and the lens 300a. Therefore, the width W1 of the inlet of the concave part 320 is less than three times the width w of the light emitting element 200a and in addition, is set to be equal to or less than twice the width w of the light emitting element 200a, thereby preventing the lens 300a and the light emitting element 200a from mis-aligning. Further, a distance between the light emitting element 200a and the light incident surface 330 is closed to reduce a quantity of light output to the outside.

Meanwhile, the upper end surface 330b of the light incident surface 330 according to the present exemplary embodiment has a flat shape. A width W2 of the upper end surface 330b is smaller than the width W1 of the inlet and is smaller than the width w of the light emitting element 200a. The width W2 of the upper end surface 330b may be determined so that an angle α formed by a straight line connecting from a center of the inlet of the concave part 320 to an edge of the upper end surface 330b along a central axis is at least 3°, or preferably, 6°. Light having an angle of beam spread ranging from +15° to −15° among the light emitted from the light emitting element 200a is incident on at least upper end surface 330b, thereby improving diffusibility of light.

When a central axis of the light emitting element 200a and the lens 300a is not precisely aligned, the upper end surface 330b prevents a directional distribution of the light emitted to the outside of the lens 300a from being greatly changed.

Meanwhile, a height H of the concave part 320 may be controlled depending on the angle of beam spread of the light emitting element 200a, a shape of the upper surface 350 of the lens 300a, the required directional distribution of light, and the like. However, according to the present exemplary embodiment, the height H of the concave part 320 may have a relatively smaller value than the lens according to the related art as the width W1 of the inlet of the concave part 320 is reduced. In particular, the height H of the concave part 320 may be smaller than a thickness of the flange 370.

Referring back to FIG. 2A, the upper surface 350 of the lens 300a has a shape to diffuse light incident into the lens 300a so that the light has a wide directional distribution. For example, the upper surface 350 of the lens 300a may have a concave surface 350a disposed near the central axis and a convex surface 350b connected to the concave surface. The concave surface 350a diffuses the light emitted near the central axis of the lens 300a to the outside, and the convex surface 350b increases a quantity of light emitted outside the central axis of the lens 300a.

Meanwhile, the flange 370 connects the upper surface 350 to the lower surface 310 and limits a size of an appearance of the lens. The side surfaces of the flange 370 and the lower surface 310 may be formed with rugged patterns. Meanwhile, the leg part 390 of the lens 300a is coupled with the circuit board 100a to fix the lens 300a. Each end of the leg parts 390 may be bonded on the circuit board 100a by, for example, an adhesive or may be fitted in holes formed on the circuit board 100a.

Meanwhile, as illustrated in FIG. 2B, there may be four leg parts 390. However, there may be other number of leg parts 390, such as three as in the related art. As illustrated in FIG. 2D, the leg parts 390 may be formed on the inclined surface 310b.

Referring to FIGS. 2A and 2D, the lower surface 310 of the lens 300a includes the flat surface 310a enclosing the concave part 320, and an inclined surface 310b enclosing the flat surface 310a. The flat surface 310a adheres to the circuit board 100a or the reflection sheet 110, and as a result, it is possible to prevent a loss of light at the lower surface of the lens 300a. In FIG. 2D, a radius of the lens 300a is represented by d/2, a length of the flat surface 310a from the light incident surface 330 to the inclined surface 310b is represented by $b_o$, and a radial length of the inclined surface 310b is represented by $b_x$.

Meanwhile, the inclined surface 310b is inclined upward, having an inclined angle β to the flat surface 310a. The inclined surface 310b is connected to the side surfaces of the lens 300a, for example, the side surfaces of the flange 370. Therefore, the side surfaces of the lens 300a are positioned at an upper portion by a height h from the flat surface 310a. The inclined angle β of the inclined surface 310b may be less than 10°. This will be described below in detail with reference to FIGS. 15 and 16.

FIGS. 3A to 3D are cross-sectional views for describing various change examples of the lens according to exemplary embodiments of the present invention. Here, various change examples of the concave part 320 of FIG. 1 will be described.

Figure 1B:
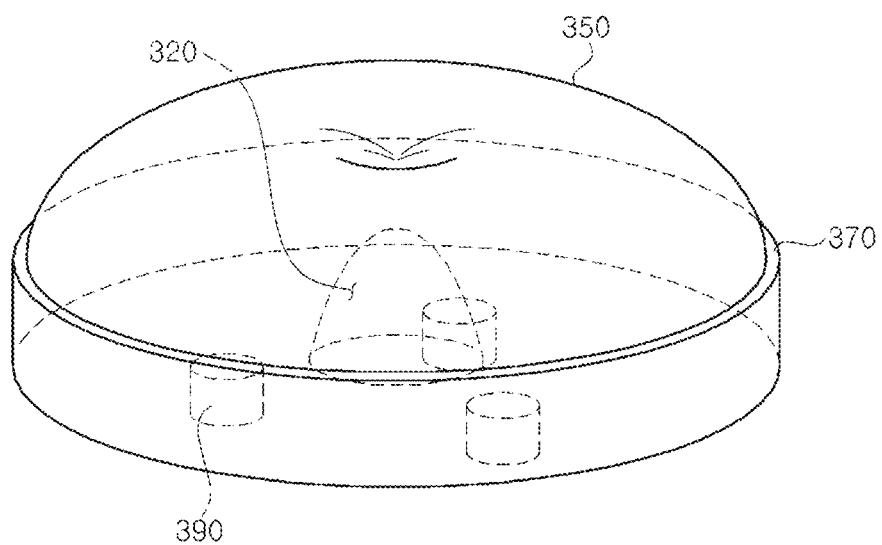
FIG. 1B is a perspective view of a lens adopted in the light emitting module according to the related art.
Figure 3A:
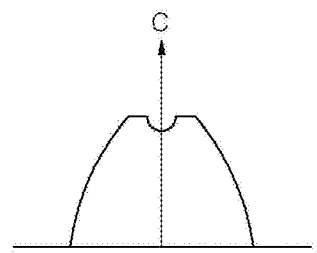
FIGS. 3A to 3D are cross-sectional views for describing various change examples of the concave part of the lens according to exemplary embodiments of the present invention.

In FIG. 3A, a portion near the central axis C of the lens 300a in the upper end surface 330b described in FIG. 1 forms a surface protruding downward. The protruding surface may primarily control the light incident near the central axis.

Figure 3B:
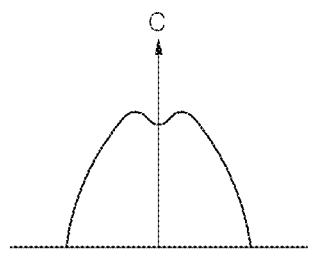

FIG. 3B is similar to FIG. 3A, but differs from FIG. 3A in that a vertical surface to the central axis in the upper end surface of FIG. 3A protrudes upward. The upper end surface has both of the surface protruding upward and the surface protruding downward and thus the change in the directional distribution of light due to an alignment error between the light emitting element and the lens may be mitigated.

Figure 3C:
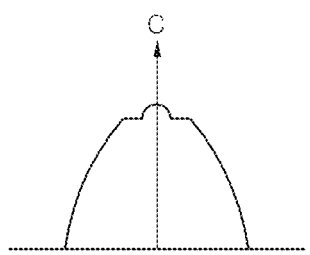

In FIG. 3C, a portion near the central axis C in the upper end surface 330b described in FIG. 1 forms a surface protruding upward. The protruding surface may better diffuse the light incident near the central axis C.

Figure 3D:
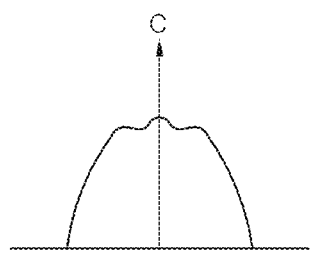

FIG. 3D is similar to FIG. 3C, but differs from FIG. 3C in that a vertical surface to the central axis C in the upper end surface of FIG. 3D protrudes downward. The upper end surface has both of the surface protruding upward and the surface protruding downward and thus the change in the directional distribution of light due to an alignment error between the light emitting element and the lens may be mitigated.

Figure 4:
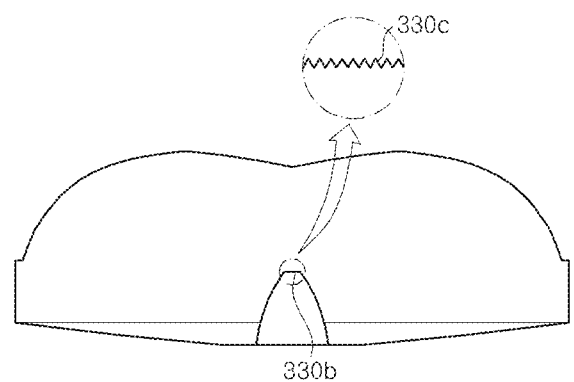
FIG. 4 is a cross-sectional view for describing another change example of the lens according to an exemplary embodiment of the present invention.

FIG. 4 is a cross-sectional view for describing a change example of a lens according to another exemplary embodiment of the present invention.

Referring to FIG. 4, a light scattering pattern 330c is formed on the upper end surface 330b. The light scattering pattern 330c may be formed as a rugged pattern.

Generally, a relatively large amount of light flux is concentrated near the central axis C of the lens. In addition, according to the present exemplary embodiment, the upper end surface 330b is a surface vertical to the central axis C and therefore the light flux may be more concentrated near the central axis C. Therefore, the light scattering pattern 330c is formed on the upper end surface 330b to be able to better diffuse the light flux near a central axis C.

Figure 5:
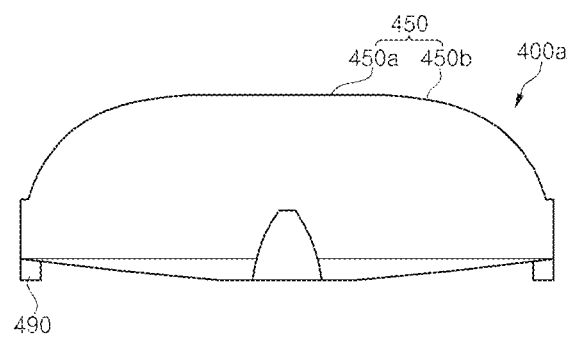
FIG. 5 is a cross-sectional view for describing another change example of the lens according to an exemplary embodiment of the present invention.

FIG. 5 is a cross-sectional view for describing a change example of a lens according to another exemplary embodiment of the present invention.

Referring to FIG. 5, a lens 400a according to the present exemplary embodiment is substantially similar to the lens 300a described with reference to FIGS. 2A to 2D, but has a different shape of an upper surface 450 and a position of leg parts 490. That is, instead of a concave surface 350a of FIG. 2A, a relatively flat surface 450a is disposed near a central axis of the lens 400a, and a convex surface 450b is connected outwardly from the flat surface 450a. Meanwhile, the leg parts 490 are disposed near side surfaces of the lens 400a.

The shape of the lens may be variously changed in consideration of the desired directional distribution of light, and the like.

Figure 6:
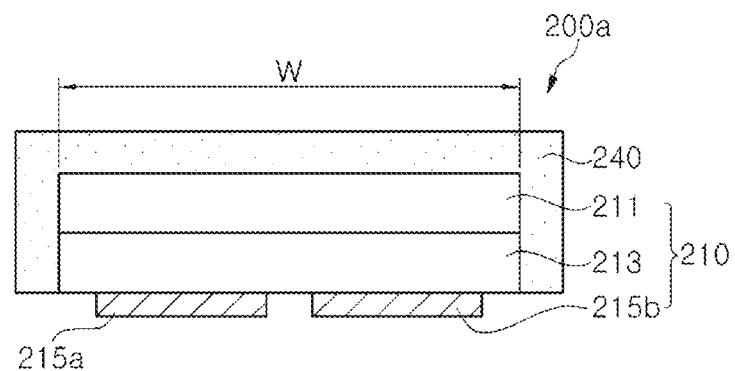
FIG. 6 is a schematic cross-sectional view for describing a light emitting element according to an exemplary embodiment of the present invention.

FIG. 6 is a schematic cross-sectional view for describing the light emitting element 200a according to an exemplary embodiment of the present invention.

Referring to FIG. 6, the light emitting element 200a includes the light emitting diode chip 210 and the wavelength conversion layer 240. The light emitting diode chip 210 includes a substrate 211 and a semiconductor laminate 213 and may further include electrode pads 215a and 215b.

The light emitting diode chip 210 is a flip-chip and the electrode pads 215a and 215b are disposed under the light emitting diode chip 210. The width w of the light emitting diode chip 210 may range from approximately 0.7 to 1.5 mm.

The substrate 211 may be a growth substrate for growing a semiconductor layer, for example, a sapphire substrate or a gallium nitride substrate. In particular, when the substrate 211 is the sapphire substrate, a refractive index is gradually reduced toward the semiconductor laminate 213, the sapphire substrate 211, and the wavelength conversion layer 240, thereby improving light extraction efficiency. According to an alternative embodiment, the substrate 211 may be omitted.

The semiconductor laminate 213 is formed of a gallium nitride-based compound semiconductor and may emit ultraviolet or blue wavelength light.

The light emitting diode chip 210 is directly mounted on the circuit board 110a. The light emitting diode chip 210 is flip-bonded without using a bonding wire and is directly connected to the printed circuit on the circuit board 100a. According to the present exemplary embodiment, since a wire is not used at the time of bonding the light emitting diode chip 210 on the circuit board 100a, there is no need for a molding part for protecting the wire and there is no need to partially remove the wavelength conversion layer 240 to expose a bonding pad. Therefore, in the light emitting diode chip 210 according to the present exemplary embodiment, a color deviation or a luminous speck phenomenon may be alleviated and the module manufacturing process may be simplified compared to using a light emitting diode chip using the bonding wire.

The flip-chip type light emitting diode chip according to the present exemplary embodiment will be described below in detail with reference to FIGS. 7 to 12.

The wavelength conversion layer 240 covers the light emitting diode chip 210. As illustrated, the conformal coated wavelength conversion layer 240, for example, a phosphor layer may be formed on the light emitting diode chip 210 and may wavelength-convert the light emitted from the light emitting diode chip 210. The wavelength conversion layer 240 is coated on the light emitting diode chip 210 and may cover the upper surface and the side surfaces of the light emitting diode chip 210. According to an alternative embodiment, the wavelength conversion layer 240 may also cover only the upper surface of the light emitting diode chip 210. Light having various colors may be implemented by using the light emitted from the light emitting diode chip 210 and the wavelength conversion layer 240, and in particular, mixed light such as white light may be implemented.

According to the present exemplary embodiment, the conformal coated wavelength conversion layer 240 is formed on the light emitting diode chip 210 in advance and thus may be mounted on the circuit board 100a along with the light emitting diode chip 210.

Hereinafter, the method of manufacturing the light emitting diode chip 210 will be described.

FIGS. 7 to 11 are diagrams for describing a method for manufacturing a flip-chip type light emitting diode chip according to the present exemplary embodiment, in which FIGS. 7A, 8A, 9A, 10A, and 11A are plan views and FIGS. 7B, 8B, 9B, 10B, and 11B are cross-sectional views taken along the line A-A.

Figure 7A:
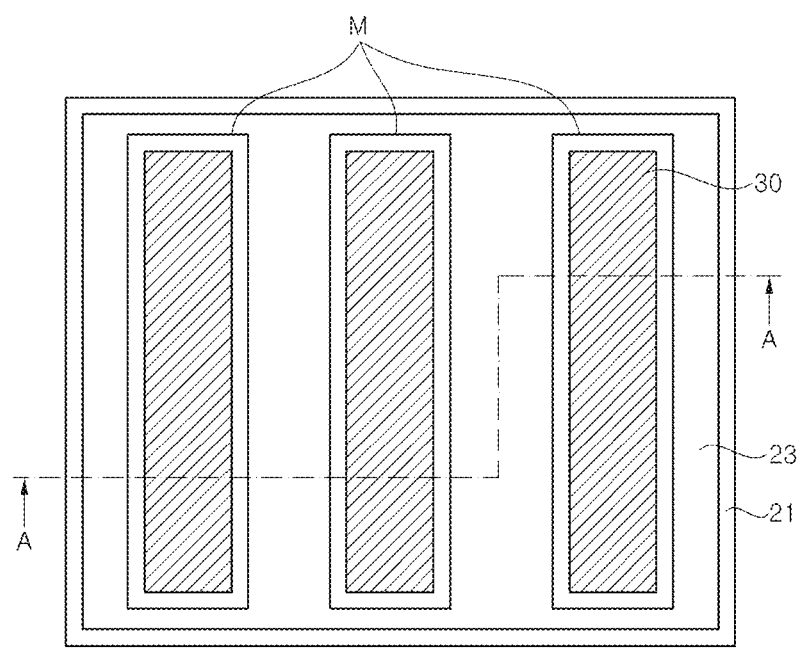
FIGS. 7A to 12 are diagrams for describing a method for manufacturing a light emitting diode chip which may be used in the light emitting element according to exemplary embodiments of the present invention, in which A in each drawing are plan views and B in each drawing are cross-sectional views taken along the line A-A.
Figure 7B:
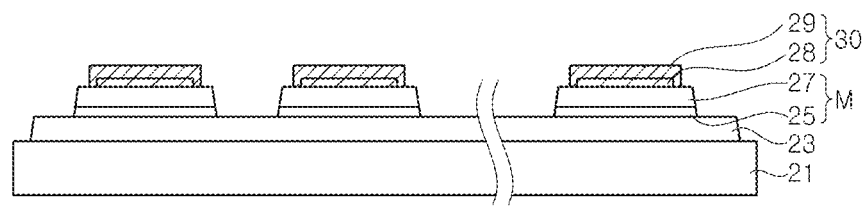

Referring first to FIGS. 7A and 7B, a first conductivity type semiconductor layer 23 is formed on a growth substrate 21 and a plurality of mesas M spaced apart from each other are formed on the first conductivity type semiconductor layer 23. The plurality of mesas M each include an active layer 25 and a second conductivity type semiconductor layer 27. The active layer 25 is disposed between the first conductivity type semiconductor layer 23 and the second conductivity type semiconductor layer 27. Meanwhile, reflection electrodes 30 are each disposed on the plurality of mesas M.

The plurality of mesas M may be formed by growing an epitaxial layer which is includes the first conductivity type semiconductor layer 23, the active layer 25, and the second conductivity type semiconductor layer 27, on the growth substrate 21 using a metal organic chemical vapor deposition method, or the like, and then patterning the second conductivity type semiconductor layer 27 and the active layer 25 to expose the first conductivity type semiconductor layer 23. The side surfaces of the plurality of mesas M may be formed to be inclined by using a technology such as photoresist reflow. An inclined profile of the side surfaces of the mesa M improves the light extraction efficiency generated from the active layer 25.

As illustrated, the plurality of mesas M may have an elongated shape extending in parallel with each other in one direction. The shape simplifies a process of forming the plurality of mesas M having the same shape in the plurality of chip areas on the growth substrate 21.

The reflection electrodes 30 may be formed on each mesa M after forming the plurality of mesas M, and therefore may be formed on the second conductivity type semiconductor layer 27 in advance prior to growing the second conductivity type semiconductor layer 27 and forming the mesas M. The reflection electrode 30 covers most of the upper surface of the mesa M and has substantially the same shape as a plane shape of the mesa M.

The reflection electrodes 30 include a reflection layer 28 and may further include a barrier layer 29. The barrier layer 29 may cover an upper surface and side surfaces of the reflection layer 28. For example, a pattern of the reflection layer 28 is formed, the barrier layer 29 is formed thereon, and thus the barrier layer 29 may be formed to cover the upper surface and the side surfaces of the reflection layer 28. For example, the reflection layer 28 may be formed by depositing and patterning Ag, Ag alloy, Ni/Ag, NiZn/Ag, and TiO/Ag layers. Meanwhile, the barrier layer 29 may be formed of a layer of Ni, Cr, Ti, Pt, Rd, Ru, W, Mo, TiW, or a composite layer thereof, and prevents a metal material of the reflection layer from being diffused or polluted.

After the plurality of mesas M are formed, an edge of the first conductivity type semiconductor layer 23 may also be etched. Therefore, the upper surface of the substrate 21 may be exposed. The side surfaces of the first conductivity type semiconductor layer 23 may also be formed to be inclined.

Figure 12:
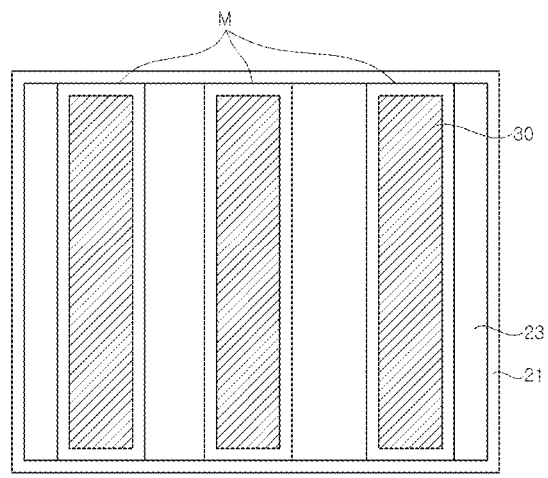

As illustrated in FIG. 7, the plurality of mesas M may be disposed on an upper area of the first conductivity type semiconductor layer 23. That is, the plurality of mesas M may be disposed on the upper area of the first conductivity type semiconductor layer 23 in an island form. As illustrated in FIG. 12, the mesas M extending in one direction may be formed to reach an upper edge of the first conductivity type semiconductor layer 23. That is, the edges in one direction of the lower surfaces of the plurality of mesas M coincide with the edges of the first conductivity type semiconductor layer 23 in one direction. Therefore, the upper surface of the first conductivity type semiconductor layer 23 is partitioned by the plurality of mesas M.

Figure 8A:
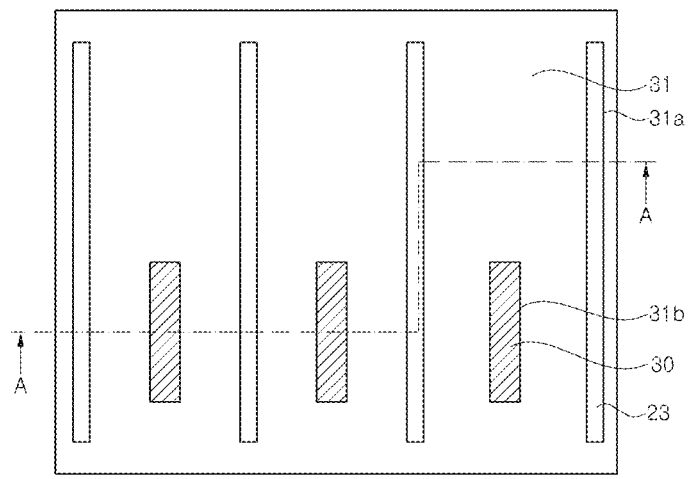
Figure 8B:
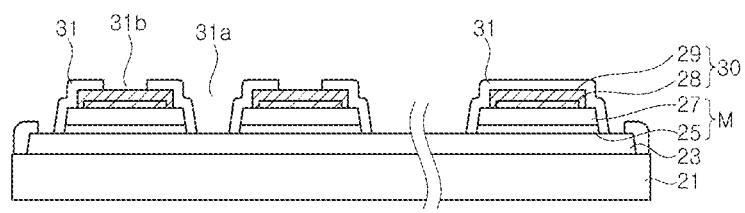

Referring to FIGS. 8A and 8B, a lower insulating layer 31 covering the plurality of mesas M and the first conductivity type semiconductor layer 23 is formed. The lower insulating layer 31 has openings 31*a* and 31*b* through which the lower insulating layer may be electrically connected to the first conductivity type semiconductor layer 23 and the second conductivity type semiconductor layer 27 in the specific area. For example, the lower insulating layer 31 may have the openings 31*a* through which the first conductivity type semiconductor layer 23 is exposed and the openings 31*b* through which the reflection electrodes 30 are exposed.

The openings 31*a* may be disposed in an area between the mesas M and near the edge of the substrate 21 and may have an elongated shaped extending along the mesas M. Meanwhile, the openings 31*b* are disposed over the mesas M and are biased to the same end sides of the mesas.

The lower insulating layer 31 may be formed of an oxide layer of $SiO_2$, and the like, a nitride layer of SiNx, and the like, and an insulating layer of SiON and $MgF_2$, by using chemical vapor deposition (CVD), and the like. The lower insulating layer 31 may be formed of a single layer or a multi-layer. Further, the lower insulating layer 31 may be formed of a distributed Bragg reflector (DBR) in which a low refractive material layer and a high refractive material layer are alternately stacked. For example, an insulating reflection layer having high reflectivity may be formed by stacking a dielectric layer of $SiO_2/TiO_2$, $SiO_2/Nb_2O_5$, or the like.

Figure 9A:
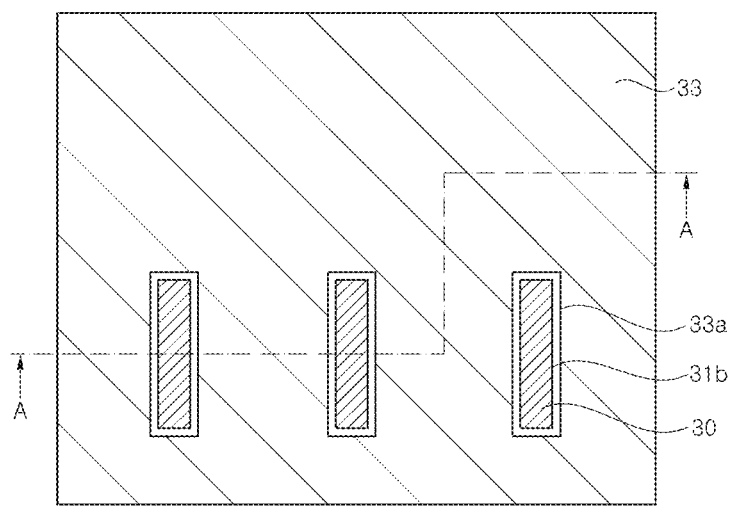
Figure 9B:
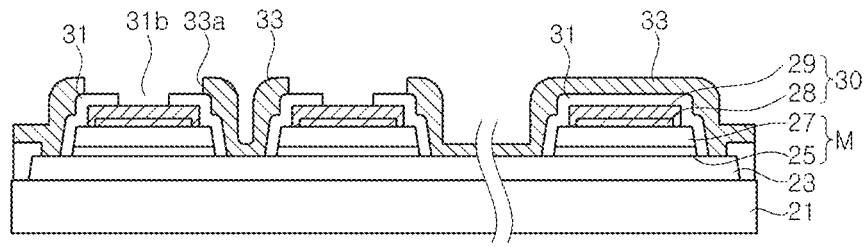

Referring to FIGS. 9A and 9B, a current diffusing layer 33 is formed on the lower insulating layer 31. The current diffusing layer 33 covers the plurality of mesas M and the first conductivity type semiconductor layer 23. Further, the current diffusing layers 33 are disposed within the upper areas of the plurality of mesas M, respectively and have openings 33*a* through which the reflection electrodes are exposed. The current diffusing layer 33 may ohmic-contact the first conductivity type semiconductor layer 23 through the openings 31*a* of the lower insulating layer 31. The current diffusing layer 33 is insulated from the plurality of mesas M and the reflection electrodes 30 by the lower insulating layer 31.

The openings 33*a* of the current diffusing layer 33 each have an area wider than that of the openings 31*b* of the lower insulating layer 31 so as to prevent the current diffusing layer 33 from connecting to the reflection electrodes 30. Therefore, side walls of the openings 33*a* are disposed on the lower insulating layer 31.

The current diffusing layer 33 is formed on the upper portion of almost all the area of the substrate 21 other than the openings 33*a*. Therefore, a current may be easily diffused through the current diffusing layer 33. The current diffusing layer 33 may include a high reflection metal layer such as an Al layer and the high reflection metal layer may be formed on an adhesive layer of Ti, Cr, Ni, or the like. Further, a protective layer having a single layer structure or a composite layer structure of Ni, Cr, Au, and the like may be formed on the high reflection metal layer. The current diffusing layer 33 may have a multi-layer structure of, for example, Ti/Al/Ti/Ni/Au.

Figure 10A:
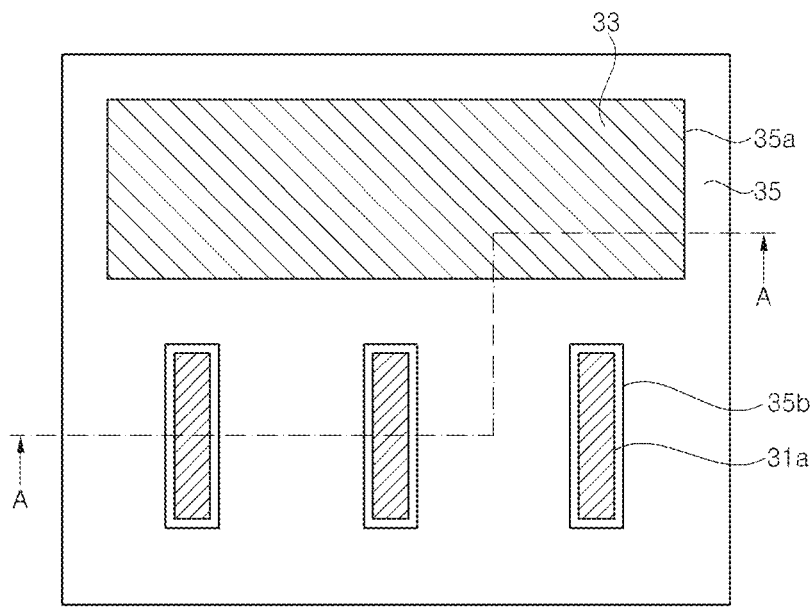
Figure 10B:
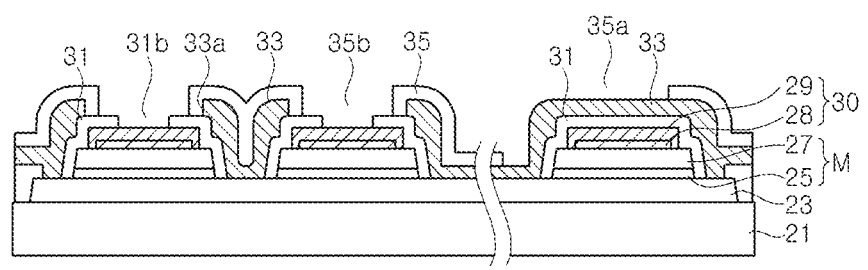

Referring to FIGS. 10A and 10B, an upper insulating layer 35 is formed on the current diffusing layer 33. The upper insulating layer 35 has openings 35*b* through which the reflection electrodes 30 are exposed, along with the opening 35*a* through which the current diffusing layer 33 is exposed. The openings 35*a* may have an elongated shape in a direction perpendicular to a length direction of the mesas M, and have an area relatively wider than that of the openings 35*b*. The openings 35*b* expose the reflection electrodes 30, which are exposed through the openings 33*a* of the current diffusing layer 33 and the openings 31*b* of the lower insulating layer 31. The openings 35*b* have an area narrower than that of the openings 33*a* of the current diffusing layer 33 and may have an area wider than that of the openings 31*b* of the lower insulating layer 31. Therefore, the side walls of the openings 33*a* of the current distributing layer 33 may be covered with the upper insulating layer 35.

The upper insulating layer 35 may be formed of an oxide insulating layer, a nitride insulating layer, a mixed layer of these insulating layers, or an intersecting layer or may be made of a polymer such as polyimide, polytetrafluoroethylene (PTFE), and parylene.

Figure 11A:
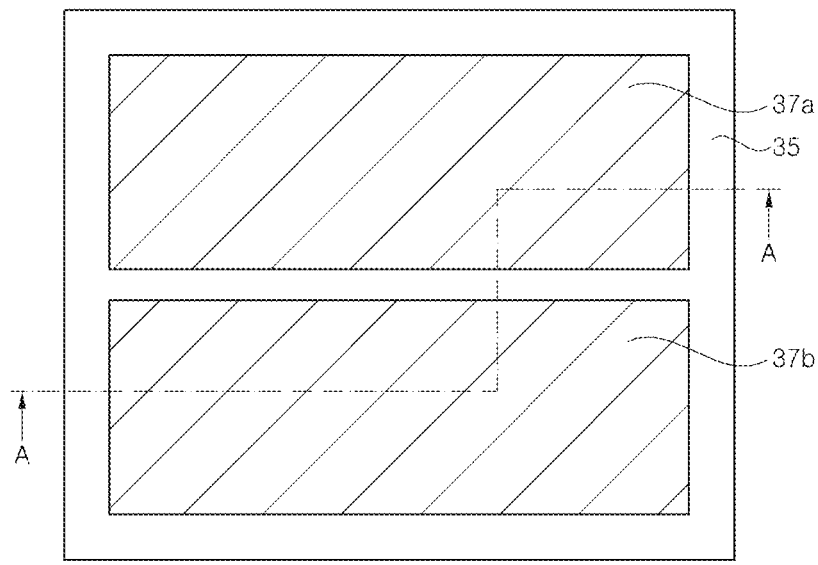
Figure 11B:
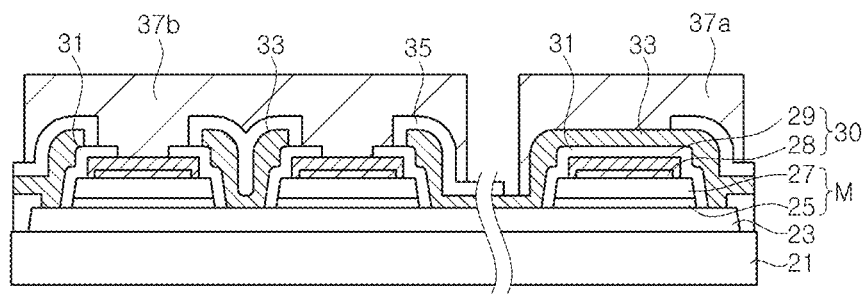

Referring to FIGS. 11A and 11B, a first pad 37*a* and a second pad 37*b* are formed on the upper insulating layer 35. The first pad 37*a* is connected to the current diffusing layer 33 through the opening 35*a* of the upper insulating layer 35 and the second pad 37*b* is connected to the reflection electrodes 30 through the openings 35*b* of the upper insulating layer 35. The first pad 37*a* and the second pad 37*b* may connect bumps for mounting light emitting diodes on the circuit board, and the like or may be used as a pad for SMT.

The first and second pads 37*a* and 37*b* may be formed by the same process and may be formed using, for example, a photolithography and/or etching or a lift off technology. The first and second pads 37*a* and 37*b* may include, for example, an adhesive layer of Ti, Cr, Ni, or the like, and a high conductivity metal layer of Al, Cu, Ag, Au, or the like. Ends of the first and second pads 37*a* and 37*b* may be formed to be disposed on the same plane, and therefore the light emitting diode chip 210 may be flip-bonded on conductive patterns which are formed to have the same height on the circuit boards 100*a*.

Next, the light emitting diode chip is completed by dividing the growth substrate 21 in an individual light emitting diode chip unit. The growth substrate 21 may also be removed from the light emitting diode chip before or after being divided in the individual light emitting diode chip unit.

Hereinafter, a structure of the light emitting diode chip according to the present exemplary embodiment will be described in detail with reference to FIGS. 11A and 11B.

The light emitting diode chip includes the first conductivity type semiconductor layer 23, the mesas M, the reflection electrodes 30, and the current diffusing layer 33, and may include the growth substrate 21, the lower insulating layer 31, the upper insulating layer 35, the first pad 37*a*, and the second pad 37*b*.

The substrate 21 may be a growth substrate for growing gallium nitride-based epitaxial layers, for example, a sapphire substrate or a gallium nitride substrate. The substrate 21 is, for example, the sapphire substrate and may have a thickness of 200 μm or more, or preferably, a thickness of 250 μm or more.

The first conductivity type semiconductor layer 23 is continuous and the plurality of mesas M are disposed on the first conductivity type semiconductor layer 23, spaced apart from each other. As described with reference to FIG. 7, the mesas M include the active layer 25 and the second conductivity type semiconductor layer 27 and have an elongated shape extending toward one side. Here, the mesas M have a stacked structure of the gallium nitride-based compound semiconductor. As illustrated in FIG. 7, the mesas M may be disposed within the upper area of the first conductive type semiconductor layer 23. Unlike this, as illustrated in FIG. 12, the mesas M may extend to an edge of the upper surface of the first conductivity type semiconductor layer 23 along one direction, and therefore the upper surface of the first conductivity type semiconductor layer 23 may be partitioned into a plurality of areas. Therefore, the current diffusing performance may be enhanced by mitigating the concentration of current near corners of the mesas M.

The reflection electrodes 30 each are disposed on the plurality of mesas M to ohmic-contact the second conductivity type semiconductor layer 27. As described with reference to FIG. 7, the reflection electrodes 300 may include the reflection layer 28 and the barrier layer 29, in which the barrier layer 29 may cover the upper surface and the side surfaces of the reflection layer 28.

The current diffusing layer 33 covers the plurality of mesas M and the first conductivity type semiconductor layer 23. The current diffusing layers 33 are disposed within the upper areas of the plurality of mesas M, respectively, and have the openings 33a through which the reflection electrodes 30 are exposed. The current diffusing layer 33 further ohmic-contacts the first conductivity type semiconductor layer 23 and is insulated from the plurality of mesas M. The current diffusing layer 33 may include a reflection metal such as Al.

The current diffusing layer 33 may be insulated from the plurality of mesas M by the lower insulating layer 31. For example, the lower insulating layer 31 may be disposed between the plurality of mesas M and the current diffusing layer 33 to insulate the current diffusing layer 33 from the plurality of mesas M. Further, the lower insulating layer 31 may be disposed within the upper areas of the mesas M, respectively, and have the openings 31b through which the reflection electrodes 30 are exposed, and may have the openings 31a through which the first conductivity type semiconductor layer 23 is exposed. The current diffusing layer 33 may be connected to the first conductivity type semiconductor layer 23 through the openings 31a. The openings 31b of the lower insulating layer 31 have an area narrower than that of the openings 33a of the current diffusing layer 33, and all are exposed by the openings 33a.

The upper insulating layer 35 covers at least a portion of the current diffusing layer 33. Further, the upper insulating layer 35 has openings 35b through which the reflection electrodes 30 are exposed. Further, the upper insulating layer 35 may have opening 35a through which the current diffusing layer 33 is exposed. The upper insulating layer 35 may cover the side walls of the openings 33a of the current diffusing layer 33.

The first pad 37a may be disposed on the current diffusing layer 33 and may be connected to the current diffusing layer 33 through, for example, the opening 35a of the upper insulating layer 35. Further, the second pad 37b is connected to the reflection electrodes 30 exposed through the openings 35b. As illustrated in FIGS. 11A and 11B, the upper ends of the first pad 37a and the second pad 37b may be positioned at the same height.

According to the present exemplary embodiment, the current diffusing layer 33 covers the mesas M and almost all the area of the first conductivity type semiconductor layer 23 between the mesas M. Therefore, a current may be easily diffused through the current diffusing layer 33.

Further, the current diffusing layer 33 includes the reflection metal layer such as Al or the lower insulating layer is formed as the insulating reflection layer to reflect the light not reflected by the reflection electrodes 30 using the current diffusing layer 33 or the lower insulating layer 31, thereby improving the light extraction efficiency.

The flip-chip type light emitting diode chip according to the present exemplary embodiment may have wide directional distribution of light, as described below.

Figure 13A:
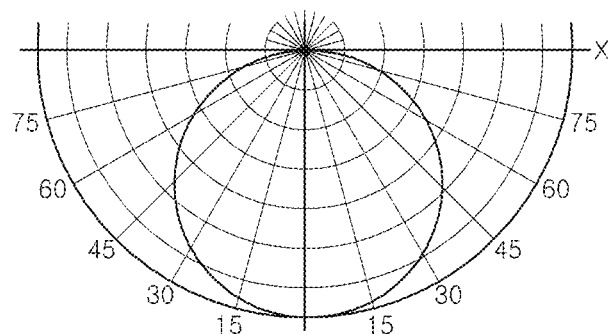
FIGS. 13A and 13B are graphs illustrating directional distributions of a light emitting diode package according to the related art, and a flip-chip type light emitting diode chip having a conformal coating layer according to an exemplary embodiment of the present invention, respectively.
Figure 13B:
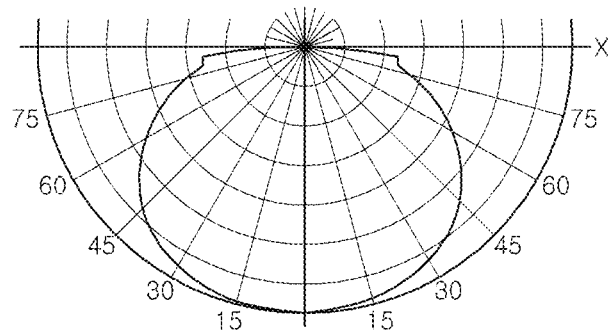

FIGS. 13A and 13B are graphs illustrating the directional distribution of the light emitting diode package 200 according to the related art and the flip-chip type light emitting diode chip 210 having the light emitting element, that is, the conformal coating layer 240 according to the exemplary embodiment of the present invention described above with respect to FIGS. 6-12.

Referring to FIG. 13A, the light emitting diode package 200 according to the related art has an angle of beam spread of about 120°. The light emitting element according to the exemplary embodiment described with respect to FIGS. 6-12 has an angle of beam spread of about 145°, as illustrated in FIG. 13B. That is, it may be appreciated that the chip level light emitting element according to the present exemplary embodiment has an angle of beam spread increased by about 25° compared to the package level light emitting element according to the related art.

Figure 14A:
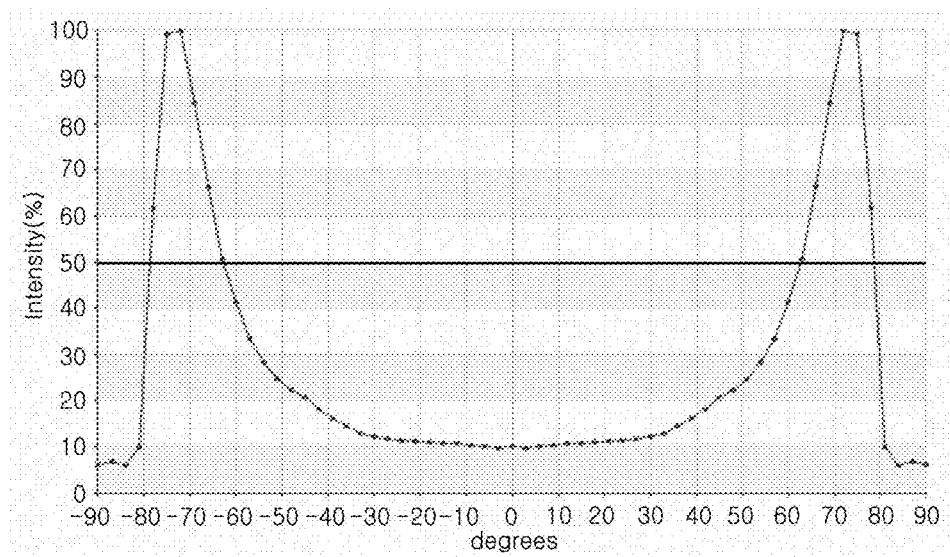
FIGS. 14A and 14B are graphs illustrating directional distributions of the light emitting module using the light emitting diode package according to the related art, and the light emitting module comprising the flip-chip type light emitting diode chip having the conformal coating layer according to an exemplary embodiment of the present invention, respectively.
Figure 14B:
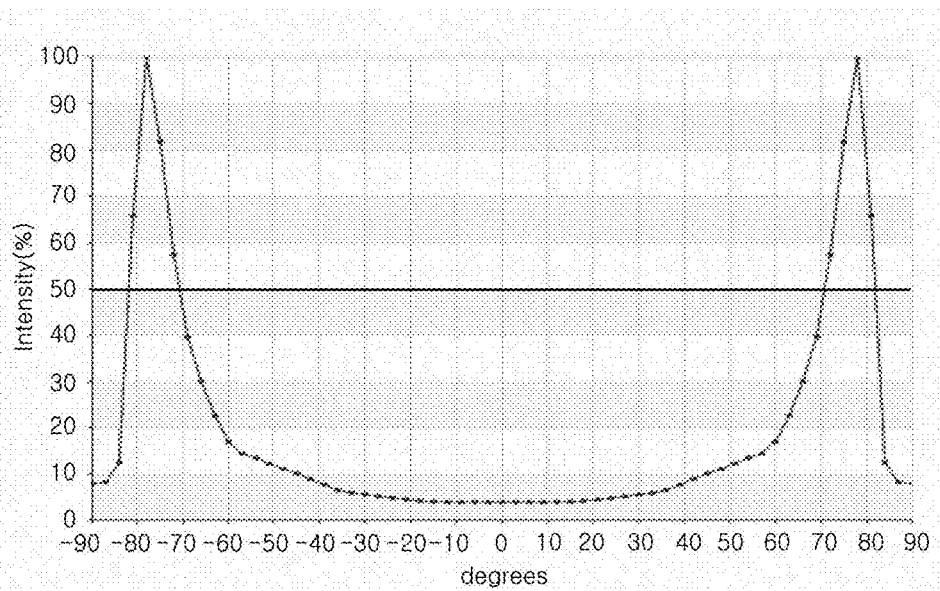

FIG. 14A illustrates the directional distribution of the light emitting module using the light emitting diode package according to the related art having the angle of beam spread of 120°, and FIG. 14B illustrates the directional distribution of the light emitting module using the flip-chip type light emitting diode chip 210 provided with the conformal coating layer 240 having the angle of beam spread of 145° according to the present exemplary embodiment. The light directional distribution in one direction is simulated by using the light emitting element and the lens having the same illumination distributions in each direction. The light directional distribution represents the luminous intensity depending on the angle of beam spread at a point spaced by 5 m from each light emitting element. Here, the lower surface of the lens is generally flat without the inclined surface 310b.

In the graphs shown in FIGS. 14A and 14B, as the angle between maximum luminous intensity values is large and the ratio C/P of the luminous intensity at the center for the maximum luminous intensity value is small, light is widely distributed and uniformly diffused. In the case of FIG. 14A, the angle between the maximum luminous intensity values is 146° and the ratio of the luminous intensity at the center for the maximum luminous intensity is 10%, and in the case of FIG. 14B, these values each are 152° and 4.5%. Further, compared with an angle at a point at which the luminous intensity is 50%, in the case of FIG. 14A, the angle is 65°, and in the case of FIG. 14B, the angle is 70°. Therefore, when the light emitting module is manufactured using the flip-chip type light emitting diode chip 210 provided with the conformal coating layer 240 according to the present exemplary embodiment, the light emitting module may be wider and may uniformly diffuse light compared to the light emitting module according to the related art.

Figure 15A:
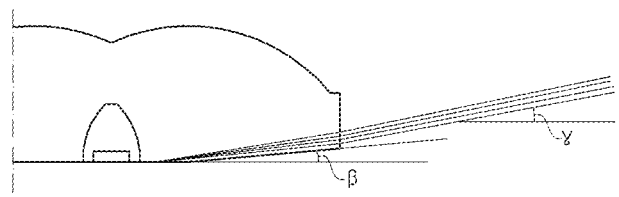
FIGS. 15A to 15C are schematic diagrams for describing a light emitting direction depending on various gradients of an inclined surface of a lower surface of the lens.
Figure 15B:
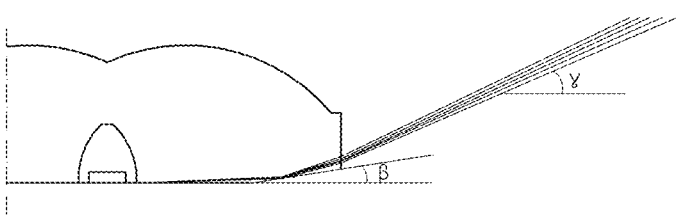
Figure 15C:
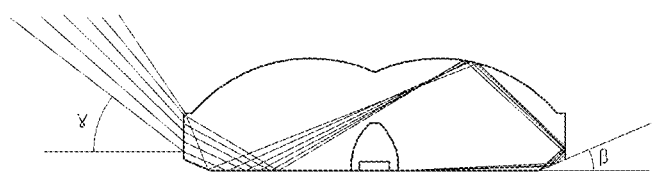

FIGS. 15A to 15C are schematic diagrams for describing a light emitting direction depending on various gradients of the inclined surface 310b of the lower surface of the lens.

A beam ray of light emitted at an angle within 0° to 3° with respect to the flat surface 310a of the lower surface of the lens from the lower portion of the side surfaces of the light emitting element 200a is simulated and an angle γ between the light emitted from the lens 300a and the flat surface 310a of the lower surface of the lens is calculated.

In the case of FIG. 15A, the inclined angle β is about 4° and the angle γ of the beam ray emitted from the lens 300a is 9°. Therefore, a light emitting angle 90-γ to the central axis of the lens is 81°.

Meanwhile, in the case of FIG. 15B, the inclined angle β is about 9.5° and the angle γ of the beam ray emitted from the lens 300a is 24°. Therefore, the light emitting angle 90-γ to the central axis of the lens is 66°.

Meanwhile, in the case of FIG. 15C, the inclined angle β is about 23° and the beam ray emitted from the lens 300a is totally reflected inside the lens 300a to be emitted through the side surface at an opposite side thereto. In this case, the angle γ is 39°. Therefore, the light emitting angle 90-γ to the central axis of the lens is 51°.

Figure 16A:
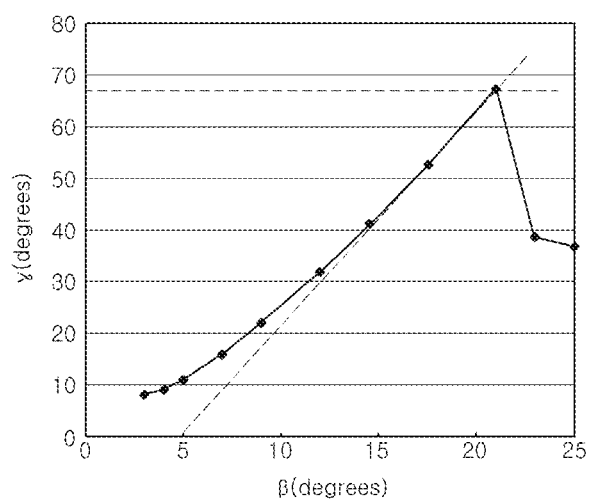
FIGS. 16A and 16B are graphs illustrating a light emitting angle depending on various gradients of the inclined surface of the lower surface of the lens.
Figure 16B:
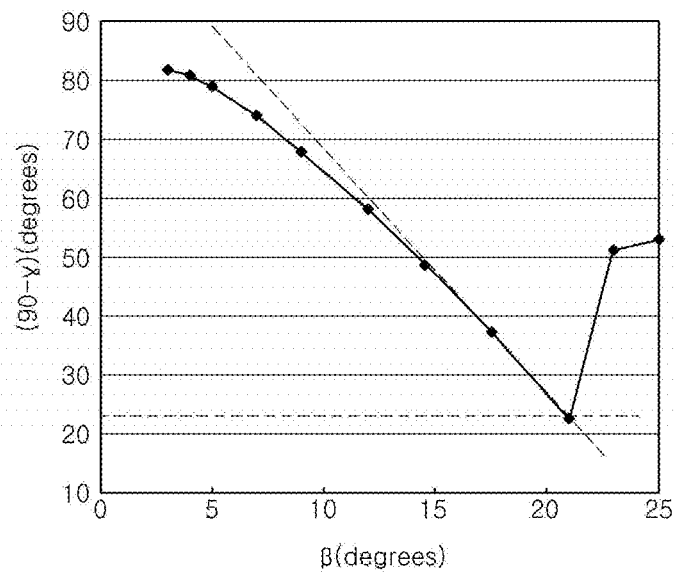

By performing the simulation in several angles, the angle γ of the beam ray depending on various inclined angles β of the inclined surface of the lower surface of the lens is calculated, which is represented by the graph of FIG. 16A and the angle of the graph of FIG. 16A is converting into the light emitting angle 90-γ, which is represented by FIG. 16B.

Referring to FIG. 16A or 16B, as the inclined angle β is increased, the angle γ is gradually increased and when the angle β exceeds about 20°, as illustrated in FIG. 15C, it may be appreciated that the internal total reflection of light inside the lens is generated. Meanwhile, in the case in which the inclined angle β is less than 5°, as the inclined angle β is increased, the angle γ is smoothly increased but in the case in which the inclined angle β is equal to or more than 5°, the angle γ is relatively suddenly increased and in the case in which the inclined angle β is equal to or more than 15°, the angle is converged to approximately a straight line.

According to the above simulation result, when the inclined angle β exceeds 20°, since the internal total reflection inside the lens 300a is generated, a loss of light occurs, and since the light emitting angle 90-γ has a value less than 70°, light is converged near the central axis of the lens to hinder the implementation of the uniform light.

Meanwhile, when the inclined angle β ranges from about 10° to 20°, the beam ray is emitted to the outside through the sides of the lens without the internal total reflection, but since the light emitting angle 90-γ has a value less than 70°, light is converged near the central axis of the lens to hinder the implementation of the uniform light.

On the other hand, when the inclined angle β is less than 10°, since the light emitting angle 90-γ exceeds approximately 70°, light may be widely diffused and therefore the inclined angle β may be less than 10°.

In the case of the light emitting element to which the light emitting diode chip 210 coated with the wavelength conversion layer 240 as described above is applied, the color deviation may be serious in the spatial color distribution of the light emitting element 200a due to the thickness of the wavelength conversion layer 240, the distribution of the phosphor within the wavelength conversion layer 240, the distribution of light emitted from the light emitting diode chip 210, and the like.

Figure 17:
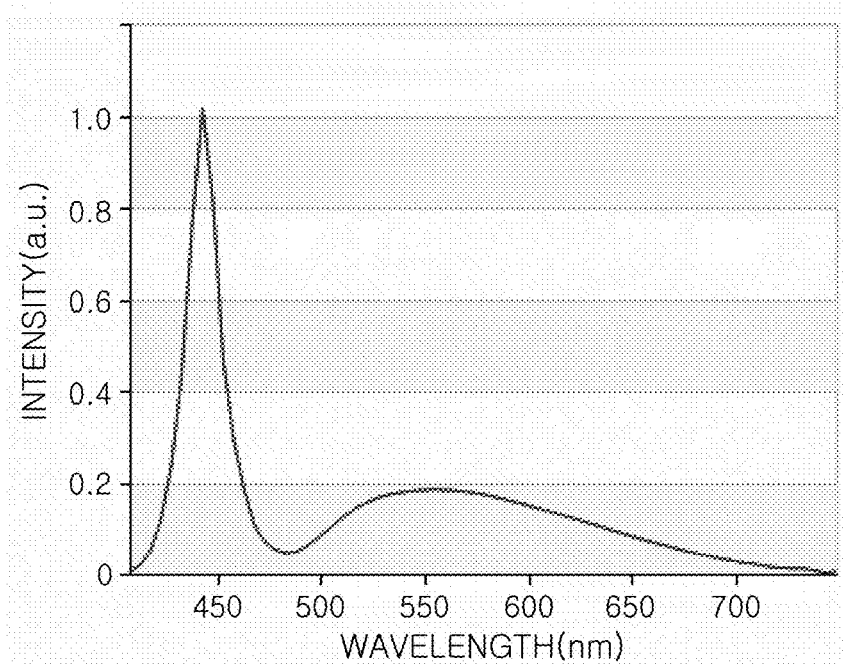
FIG. 17 is a graph illustrating a light spectrum of a light emitting element according to an exemplary embodiment of the present invention.

FIG. 17 is a graph illustrating a light spectrum of the light emitting element 200a according to an exemplary embodiment of the present invention.

Referring to FIG. 17, a mixed light spectrum of blue light of the light emitting diode chip 210 and yellow light of the phosphor may be observed. The blue light has a peak wavelength of about 450 nm and the yellow light has a wide spectrum distribution from a green to a red wavelength.

Figure 18:
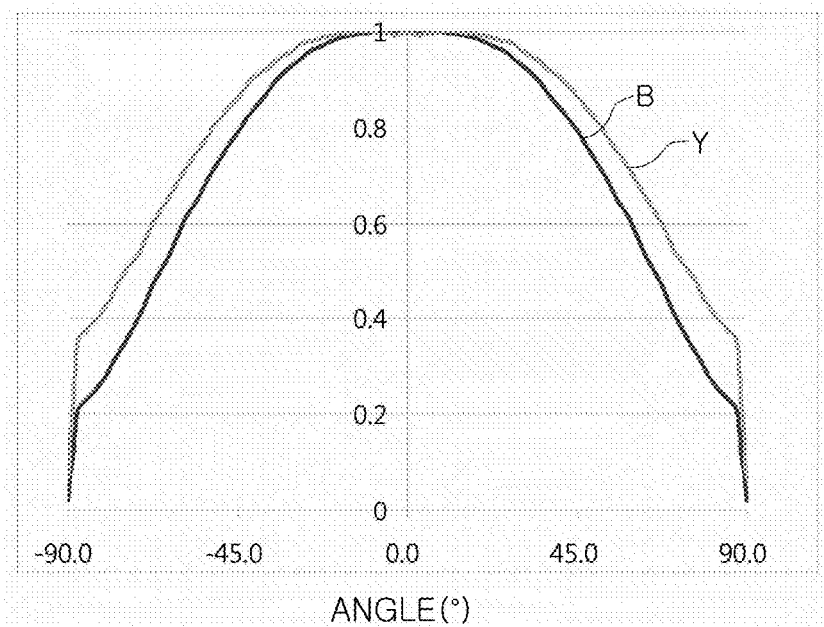
FIG. 18 is a graph illustrating light directional distribution of blue light and yellow light, respectively, of the light emitting element according to the exemplary embodiment of the present invention.

FIG. 18 is a graph illustrating light directional distributions of the blue light and the yellow light, respectively, of the light emitting element 200a according to an exemplary embodiment of the present invention. The light emitted from the light emitting diode chip 210 is filtered using a blue light filter and a yellow light filter to measure the light directional distributions of each light. The light directional distribution of the blue light is measured using the blue filter, transmitting light of 400 to 500 nm, and the light directional distribution of the yellow light is measured using a yellow filter, transmitting light of 500 to 800 nm.

Referring to FIG. 18, light distributions of blue light B and yellow light Y are similar to each other near the angle of beam spread of 0°, but in the angle of beam spread which is equal to or more than 15°, the difference in the light distributions occurs and thus the spatial color deviation occurs.

When a light diffusion lens is applied to the light emitting element, it may be necessary to reduce the spatial color deviation. Hereinafter, the lens to minimize the spatial color deviation will be described.

Figure 19:
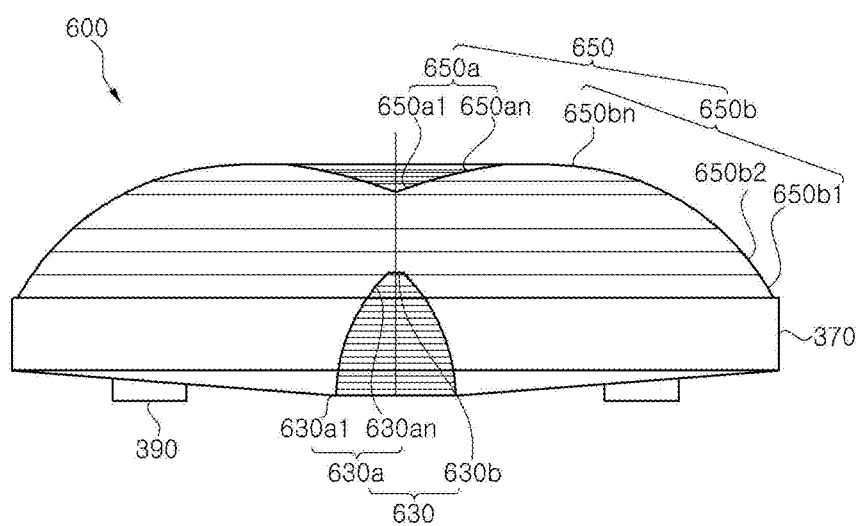
FIG. 19 is a cross-sectional view for describing a lens according to an exemplary embodiment of the present invention.
Figure 20:
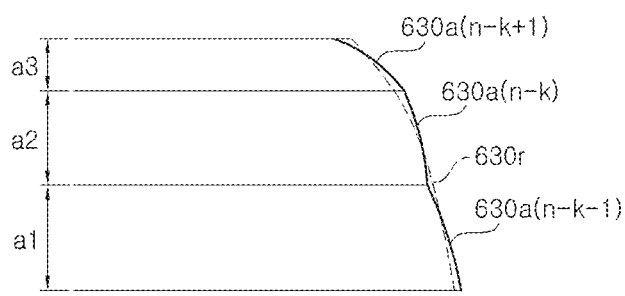
FIG. 20 is a schematically partially enlarged cross-sectional view for describing a light incident surface of the lens of FIG. 19.
Figure 21:
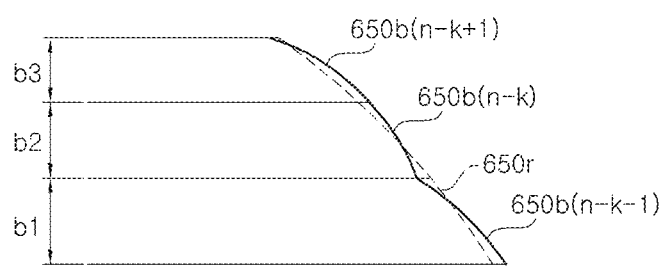
FIG. 21 is a schematically partially enlarged cross-sectional view for describing a light emitting surface of the lens of FIG. 19.

FIG. 19 is a cross-sectional view for describing a lens 600 according to an exemplary embodiment of the present invention, FIG. 20 is a partial enlarged view of a light incident surface 630 of the lens 600, and FIG. 21 is a partial enlarged view of an upper surface 650 of the lens 600.

The lens according to the present exemplary embodiment is substantially similar to the lens 300a described with reference to FIGS. 2A to 2D, but differs from the lens 300a in that it includes a light incident surface 630 of a concave part, a concave part 650a and a convex part 650b of an upper surface 650, and a plurality of sections 630a1 to 630an, 650a1 to 650an, and 650b1 to 650bn. Hereinafter, the description overlapping with the lens 300a described above with reference to FIGS. 2A to 2D will be omitted, and the plurality of sections 630a1 to 630an, 650a1 to 650an, and 650b1 to 650bn will be described.

Referring first to FIGS. 19 and 20, adjacent sections of the plurality of sections 630a1 to 630an may have different curvatures. The sections having different curvatures are continuously connected to configure a side surface 630a of the light incident surface.

The plurality of sections 630a1 to 630an may include a first section 630a (n–k–1), a second section 630a (n–k), and a third section 630a (n–k+1) which are connected to each other in a vertical direction, as illustrated in FIG. 20. A curvature of the second section 630a (n–k) differs from that of the first section 630a (n–k–1) and the third section 630a (n-k+1). Further, the curvature of the first section 630a (n–k–1) may differ from or be equal to that of the third section 630a (n-k+1).

Meanwhile, thicknesses a1, a2, and a3 of the first section 630a (n–k–1), the second section 630a (n–k), and the third section 630a (n–k+1), respectively, are equal to or greater than 1 μm and are less than the width of the light emitting element 200a. When the thickness of each section is less than 1 μm, an interference or diffraction phenomenon of light transmitting each section is serious. Further, when the thickness of each section is excessively large, it is difficult to achieve a desired effect.

The thicknesses a1, a2, and a3 of the first section 630a (n−k−1), the second section 630a (n−k), and the third section 630a (n−k+1), respectively, may be the same or different from one another. Further, all the vertical direction thicknesses of the plurality of sections 630a1 to 630an are equal to or greater than 1 µm and may be smaller than the width of the light emitting element 200a. By making the curvatures of the adjacent sections different, color separation of the light incident on the light incident surface 630 may be made depending on the wavelength.

The plurality of sections 630a1 to 630an may be disposed in an area of 15° or more from the central axis in consideration of the light directional distribution for each spectrum of the light emitting diode chip 210, in particular. That is, the plurality of sections 630a1 to 630an is not disposed in the area less than 15° from the central axis.

Meanwhile, as illustrated in FIG. 20, the first section 630a (n−k−1), the second section 630a (n−k), and the third section 630a (n−k+1) may be sequentially connected to one another so that a virtual reference surface 630r having a single curvature goes across the first section 630a (n−k−1), the second section 630a (n−k), and the third section 630a (n−k+1). The virtual reference surface 630r having the single curvature may be the side surface 330a of the light incident surface 330 of FIG. 2A. Further, a distance between each point on the first section 630a (n−k−1), the second section 630a (n−k), and the third section 630a (n−k+1) and the virtual reference surface 630r does not exceed 10 µm, or preferably, about 5 µm.

Referring to FIGS. 19 and 21, adjacent sections of the plurality of sections 650b1 to 650bn may have different curvatures. The sections having different curvatures may be continuously connected to configure the convex part 650b.

The plurality of sections 650b1 to 650bn include a first section 650b (n−k−1), a second section 650b (n−k), and a third section 650b (n−k+1) which are connected to each other in a vertical direction as illustrated in FIG. 21. A curvature of the second section 650b (n−k) differs from that of the first section 650b (n−k−1) and the third section 650b (n−k+1). Further, the curvature of the first section 650b (n−k−1) may differ from or may be equal to that of the third section 650b (n−k+1).

Meanwhile, thicknesses b1, b2, and b3 of the first section 650b (n−k−1), the second section 650b (n−k), and the third section 650b (n−k+1), respectively, are equal to or greater than 1 µm and are smaller than the width of the light emitting element 200a. When the thicknesses of each section are less than 1 µm, an interference or diffraction phenomenon of light transmitting each section is serious. Further, when the thicknesses of each section are excessively large, it may be difficult to achieve a desired effect.

Meanwhile, the thicknesses b1, b2, and b3 of the first section 650b (n−k−1), the second section 650b (n−k), and the third section 650b (n−k+1), respectively, may be the same or different from one another. Further, all the thicknesses of the plurality of sections 650b1 to 650bn are equal to or greater than 1 µm and may be smaller than the width of the light emitting element 200a. By making the curvatures of the adjacent sections different, the color separation of the light emitted from the convex part 650b may be made depending on the wavelength.

Meanwhile, as illustrated in FIG. 21, the first section 650b (n−k−1), the second section 650b (n−k), and the third section 650b (n−k+1) may be sequentially connected to one another so that a virtual reference surface 650r having a single curvature goes across the first section 650b (n−k−1), the second section 650b (n−k), and the third section 650b (n−k+1). The virtual reference surface 650r having the single curvature may be a portion of the convex surface 350b of FIG. 2A. Further, a distance between each point on the first section 650b (n−k−1), the second section 650b (n−k), and the third section 650b (n−k+1) and the virtual reference surface 650r may not exceed 10 µm, or preferably, about 5 µm.

The concave part 650a of the upper surface 650 may also include the plurality of sections 650a1 to 650an and these sections 650a1 to 650an may include the first, second, and third sections similar to the exemplary embodiment described above with respect to the convex part 650b. The plurality of sections 650a1 to 650an may be configured by the method similar to the plurality of sections 650b1 to 650bn, and a detailed description thereof will be omitted to avoid overlapping description. However, the thicknesses of the plurality of sections 650a1 to 650an, respectively, may be smaller than those of the plurality of sections 650b1 to 650bn, respectively.

The plurality of sections 650a1 to 650an may be disposed in consideration of the light directional distributions (see FIG. 19) for each spectrum of the light emitting element 200a. Therefore, the plurality of sections 650a1 to 650an are disposed in the areas of 15° or more from the central axis, and the relatively smaller number of sections 650a1 to 650an may be disposed in the area less than 15° from the central axis.

Figure 22:
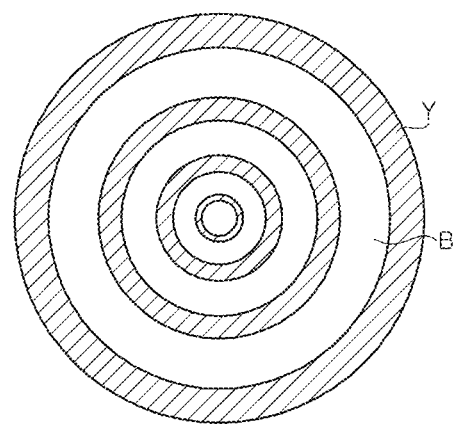
FIG. 22 is a schematic diagram for describing a color distribution of light implemented by the lens of FIG. 19.

FIG. 22 is a schematic diagram for describing the color distribution of light implemented by the lens of FIG. 19.

Referring to FIG. 22, the light emitted through the lens 600 is divided into, for example, a dark blue area B and a dark yellow area Y. Since the light incident surface 630 and the upper surface 650 have a rotating body shape symmetrical to the central axis, each of the areas B and Y may be represented by a ring shape.

As the light incident surface 630 and the upper surface 650 of the lens 600 may be divided into denser sections, the light emitted through the lens 600 may be divided into more areas B and Y.

Figure 23A:
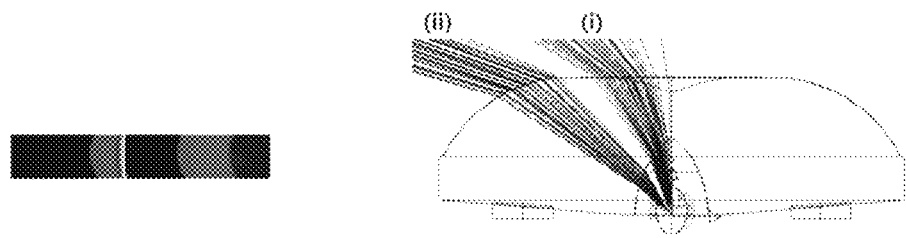
Figure 23B:
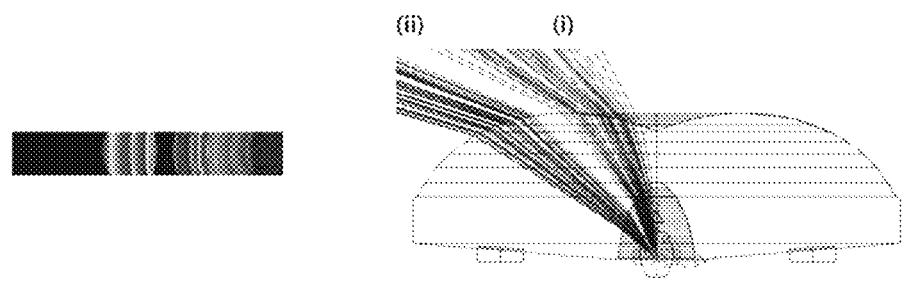

FIGS. 23A and 23B are simulation diagrams for describing the spatial distribution of light depending on whether the plurality of sections is formed, in which FIG. 23A illustrate the spatial distribution of light in the case in which the plurality of sections is not present and FIG. 23B illustrate the spatial distribution of light depending on the formation of the plurality of sections.

In order to find out the spatial distribution for each spectrum of the light emitted through the lens, blue light and green light are identically incident into an area i of 20° or less from the central axis based on the light incident surface and an area ii of 30° to 50° from the central axis to simulate the color distribution of light transmitting the lens.

As illustrated in FIG. 23A, when the plurality of sections is not formed, the light incident into the area i is mixed well, but green light of the light incident into the area is not diffused well, and the light incident into the area ii is intensively distributed into a narrow space. The concentration phenomenon of green light generates the color deviation.

Meanwhile, as illustrated in FIG. 23B, when the plurality of sections 630a1 to 630an, 650a1 to 650an, and 650b1 to 650bn is formed, it may be appreciated that the light incident into the areas i and ii is mixed well and is widely diffused. Therefore, when light is incident into the overall area of the light incident surface, the blue light and green light are widely diffused and thus the color mixing may be good.

Figure 24A:
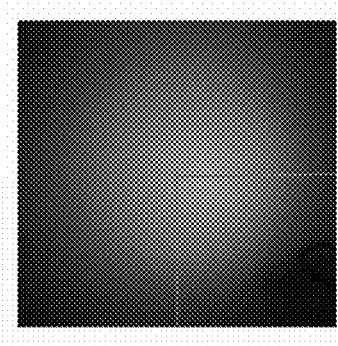
FIG. 24A is a photograph of the actually implemented color distribution of light from the light emitting module in which the plurality of light emitting elements is coupled with the lens of FIG. 19.
Figure 24B:
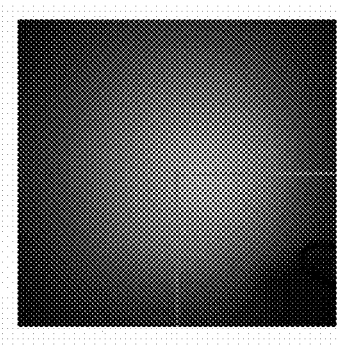
FIG. 24B is an enlarged photograph of a portion of FIG. 24A.

FIGS. 24A and 24B are photographs illustrating the actually implemented color distribution of light, in which FIG. 24B is an enlarged photograph of a portion of FIG. 24A. The color distribution of light is obtained by photographing an image of light irradiated to a diffusion plate spaced by about 25 mm from the lens.

As illustrated in FIGS. 24A and 24B, when the lens according to an exemplary embodiment of the present invention is applied, the dark blue area B and the dark yellow area Y are repeated in the ring shape by the color separation of the blue light emitted from the light emitting diode chip 210 and the yellow light emitted from the wavelength conversion layer 240.

Figure 25:
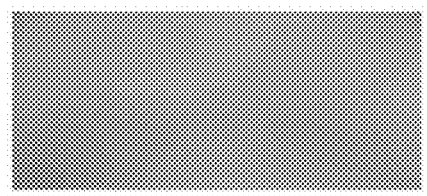
FIG. 25 is a photograph for describing a color distribution of a light emitting module in which the plurality of light emitting elements is coupled with the lens of FIG. 19.

FIG. 25 is a photograph for describing the color distribution of the light emitting module in which the plurality of light emitting elements are each coupled with the lens as described in FIG. 19. The color distribution of the light emitting module is obtained by photographing the image of light irradiated to the diffusion plate spaced about 25 mm from the lens.

Referring to FIG. 25, it may be confirmed that the light emitted from the light emitting module represents uniform color distribution over a wide area. That is, the dark blue area B and the dark yellow area Y are divided into a plurality of dense areas to overlap these areas each other in the overall light emitting module, thereby implementing uniform color distribution.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A light emitting module, comprising:
   a circuit board;
   light emitting elements disposed on the circuit board, each light emitting element comprising:
      light emitting diode chips; and
      a wavelength conversion layer coated on the light emitting diode chips; and
   a lens disposed on the light emitting elements and configured to diffuse light emitted from the light emitting elements,
   wherein:
   the lens comprises a concave part comprising a light incident surface and an upper surface through which light exits out from the lens;
   the upper surface comprises a convex portion including sections, at least two of the sections having different curvatures from each other; and
   the at least two of the sections each has a thickness equal to or greater than 1 μm, and less than the width of the light emitting element.

2. The light emitting module of claim 1, wherein:
   the upper surface of the lens has a flat surface near a central axis of the lens; and
   the convex portion is connected outwardly from the flat surface.

3. The light emitting module of claim 1, wherein:
   the light emitting diode chips comprise a flip-chip type light emitting diode chip flip-bonded to the circuit board; and
   the light emitting element is disposed directly under the concave part of the lens along a first direction.

4. The light emitting module of claim 1, wherein:
   the width of an inlet of the concave part of the lens is greater than the width of the light emitting element; and
   the width of the inlet is less than three times the width of the light emitting element.

5. The light emitting module of claim 1, wherein the upper surface of the lens comprises:
   the convex portion having a decreasing width along a first direction extending away from the light emitting elements; and
   a concave portion having an increasing width along the first direction extending away from the light emitting elements, the concave portion is disposed closer to a central axis of lens than the convex portion.

6. The light emitting module of claim 5, wherein the concave portion comprises a plurality of sections each having a thickness less than the thickness of the sections of the convex portion.

7. The light emitting module of claim 1, wherein the lens further comprises a flange connecting the upper surface of the lens to the concave part.

8. The light emitting module of claim 7, wherein the lens further comprises an inclined surface from an entrance of the concave part to the flange.

9. The light emitting module of claim 7, wherein one of the sections is disposed between the upper surface adjacent to a central axis of the lens and the flange, and surrounds the central axis.

10. A lens configured to diffuse light emitted from light emitting elements, the lens comprising:
    a concave part defining a light incident surface; and
    an upper surface through which light incident on the lens exits the lens,
    wherein:
    the upper surface comprises a convex portion including sections, at least two of the sections having different curvatures from each other; and
    the at least two of the sections each has a thickness equal to or greater than 1 μm, and less than the width of the light emitting element.

11. The lens of claim 10, wherein:
    the upper surface of the lens comprises a flat surface is disposed near a central axis of the lens; and
    the convex portion is connected outwardly from the flat surface.

12. The lens of claim 10, wherein:
    the light incident surface comprises an upper end surface and side surfaces connected from the upper end surface to an inlet of the concave part; and
    the concave part has a shape with decreasing width along a first direction extending from the inlet to the upper end surface.

13. The lens of claim 10, further comprising:
    a lower surface comprising a flat surface enclosing the concave part; and
    an inclined surface enclosing the flat surface.

14. The lens of claim 10, wherein the upper surface comprises:
    a convex portion having a decreasing width along a first direction extending away from the light incident surface; and
    a concave portion having an increasing width along the first direction extending away from the light incident surface, the concave portion is disposed closer to a central axis of lens than the convex portion.

15. The lens of claim 14, wherein the concave portion comprises sections each having a thickness less than the thicknesses of the sections of the convex portion.

16. The lens of claim 10, wherein the lens further comprises a flange connecting the upper surface to the concave part.

17. The lens of claim 16, wherein the lens further comprises an inclined surface from an entrance of the concave part to the flange.

18. The lens of claim 16, wherein one of the sections is disposed between the upper surface adjacent to a central axis of the lens and the flange, and surrounds the central axis.

* * * * *